United States Patent
Dunga et al.

(10) Patent No.: US 9,082,502 B2
(45) Date of Patent: Jul. 14, 2015

(54) BIT LINE AND COMPARE VOLTAGE MODULATION FOR SENSING NONVOLATILE STORAGE ELEMENTS

(71) Applicant: SANDISK TECHNOLOGIES, INC., Plano, CA (US)

(72) Inventors: Mohan V. Dunga, Santa Clara, CA (US); Masaaki Higashitani, Cupertino, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 51 days.

(21) Appl. No.: 14/051,416

(22) Filed: Oct. 10, 2013

(65) Prior Publication Data

US 2015/0103595 A1  Apr. 16, 2015

(51) Int. Cl.
| | | |
|---|---|---|
| G11C 16/04 | (2006.01) | |
| G11C 16/34 | (2006.01) | |
| G11C 11/56 | (2006.01) | |

(52) U.S. Cl.
CPC ........ *G11C 16/3454* (2013.01); *G11C 11/5628* (2013.01); *G11C 11/5642* (2013.01); *G11C 16/3459* (2013.01)

(58) Field of Classification Search
CPC ........... G11C 16/3459; G11C 16/3454; G11C 11/5628; G11C 11/5642; G11C 2211/5621
USPC ............................. 365/185.03, 185.21, 185.22
See application file for complete search history.

(56) References Cited

U.S. PATENT DOCUMENTS

| | | |
|---|---|---|
| 5,673,223 A | 9/1997 | Park |
| 6,125,052 A | 9/2000 | Tanaka |
| 6,327,202 B1 | 12/2001 | Roohparvar |
| 6,850,439 B1 | 2/2005 | Tanaka |
| 6,891,758 B2 | 5/2005 | Roohparvar |
| 6,975,542 B2 | 12/2005 | Roohparvar |
| 6,982,905 B2 | 1/2006 | Nguyen |
| 7,020,017 B2 | 3/2006 | Chen |
| 7,082,055 B2 | 7/2006 | Ichige |
| 7,200,043 B2 * | 4/2007 | Chen ........................ 365/185.22 |

(Continued)

FOREIGN PATENT DOCUMENTS

| | | |
|---|---|---|
| GB | 2332766 | 6/1999 |
| JP | 2007080424 | 3/2007 |

OTHER PUBLICATIONS

PCT International Search Report dated Mar. 21, 2012, International Application No. PCT/US2011/053550.

(Continued)

*Primary Examiner* — David Lam
(74) *Attorney, Agent, or Firm* — Vierra Magen Marcus LLP

(57) ABSTRACT

In a block of non-volatile memory, bit line current increases with bit line voltage. For current sensing memory systems, average bit line current during a sensing operation need only exceed a certain threshold amount in order to produce a correct result. For the first word lines being programmed in a block, memory cells connected thereto see relatively low bit line resistances during verify operations. In the disclosed technology, verify operations are performed for these first programmed word lines with lower verify bit line voltages in order to reduce excess bit line current and save power. During read operations, this scheme can make threshold voltages of memory cells connected to the lower word lines appear lower. In order to compensate for this effect, various schemes are disclosed.

27 Claims, 20 Drawing Sheets

(56) References Cited

U.S. PATENT DOCUMENTS

| | | |
|---|---|---|
| 7,295,478 B2 | 11/2007 | Wan |
| 7,295,486 B2 | 11/2007 | Chen |
| 7,342,831 B2 | 3/2008 | Mokhlesi |
| 7,403,424 B2 | 7/2008 | Hamink |
| 7,411,826 B2 | 8/2008 | Ichige |
| 7,460,407 B2 | 12/2008 | Mokhlesi |
| 7,468,919 B2 | 12/2008 | Sekar |
| 7,495,954 B2 | 2/2009 | Ito |
| 7,551,477 B2 | 6/2009 | Mokhlesi |
| 7,583,535 B2 | 9/2009 | Sekar |
| 7,590,002 B2 | 9/2009 | Mokhlesi |
| 7,596,035 B2 | 9/2009 | Doyle |
| 7,663,929 B2 | 2/2010 | Ogawa |
| 7,668,001 B2 | 2/2010 | Tajiri |
| 7,688,614 B2 | 3/2010 | Morimoto |
| 8,194,472 B2 | 6/2012 | Sato |
| 8,441,853 B2 | 5/2013 | Li |
| 2002/0031003 A1 | 3/2002 | Hoya |
| 2002/0159315 A1 | 10/2002 | Noguchi |
| 2006/0133142 A1 | 6/2006 | Futatsuyama |
| 2006/0280021 A1 | 12/2006 | Chen |
| 2007/0291566 A1 | 12/2007 | Mokhlesi |
| 2008/0094900 A1 | 4/2008 | Nakamura |
| 2008/0159007 A1 | 7/2008 | Sekar |
| 2008/0253217 A1 | 10/2008 | Taeuber |
| 2009/0003087 A1 | 1/2009 | Doyle |
| 2009/0080265 A1 | 3/2009 | Mokhlesi |
| 2010/0128532 A1 | 5/2010 | Hwang |
| 2012/0081964 A1 | 4/2012 | Li |
| 2013/0250688 A1 | 9/2013 | Chen |
| 2013/0250689 A1 | 9/2013 | Lai |
| 2013/0250690 A1 | 9/2013 | Lai |

OTHER PUBLICATIONS

PCT Written Opinion of the International Searching Authority dated Mar. 21, 2012, International Application No. PCT/US2011/053550.

Filing Receipt, U.S. Appl. No. 13/755,894, filed Jan. 31, 2013, by Lee, et al.

Filing Receipt, U.S. Appl. No. 13/767,708, filed Feb. 14, 2013, by Costa, et al.

Filing Receipt, U.S. Appl. No. 13/910,377, filed Jun. 5, 2013, by Dong, et al.

Filing Receipt, U.S. Appl. No. 13/940,504, filed Jul. 12, 2013, by Dong, et al.

PCT International Search Report dated Dec. 17, 2014, PCT Patent Application No. PCT/US2014/056403.

PCT Written Opinion of the International Searching Authority dated Dec. 17, 2014, PCT Patent Application No. PCT/US2014/056403.

Article 19 Amendment dated Mar. 2, 2015, PCT Patent Application No. PCT/US2014/056403.

* cited by examiner

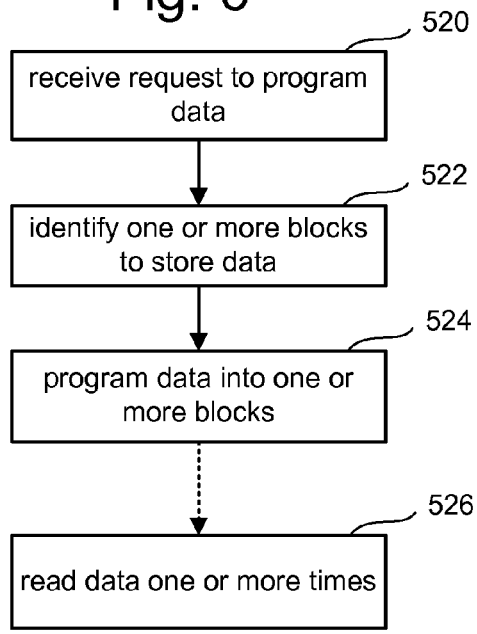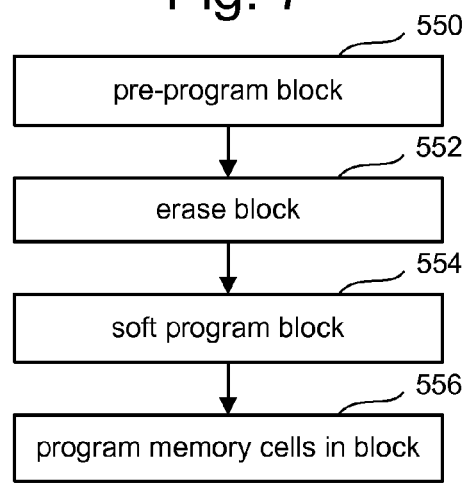

|     | First Page | Second Page | Third Page |
|-----|------------|-------------|------------|
| WL0 | 1          | 3           | 6          |
| WL1 | 2          | 5           | 9          |
| WL2 | 4          | 8           | 11         |
| WL3 | 7          | 10          | 12         |

Fig. 16A

|  | Current | Proposed |
|---|---|---|
| WL85-127 | 0.2V | 0.2V |
| WL43-84 | 0.2V | 0.175V |
| WL0-42 | 0.2V | 0.15V |

Fig. 16B

|  | Current | Proposed |
|---|---|---|
| WL85-127 | 0.2V | 0.2V (Vcgv) |
| WL43-84 | 0.2V | 0.175V (Vcgv+Δ2) |
| WL0-42 | 0.2V | 0.15V (Vcgv+Δ1) |

Fig. 16C

|  | Current Vbl | Proposed Vbl | | |
|---|---|---|---|---|
| Max Pgm WL |  | ≤ WL42 | >WL42 & ≤WL84 | >WL84 |
| WL85-127 | 0.2V | - | - | 0.2V (Vcgr) |
| WL43-84 | 0.2V | - | 0.175V (Vcgr+Δ2) | 0.2V (Vcgr) |
| WL0-42 | 0.2V | 0.15V (Vcgr+Δ1) | 0.175V (Vcgr+Δ2) | 0.2V (Vcgr) |

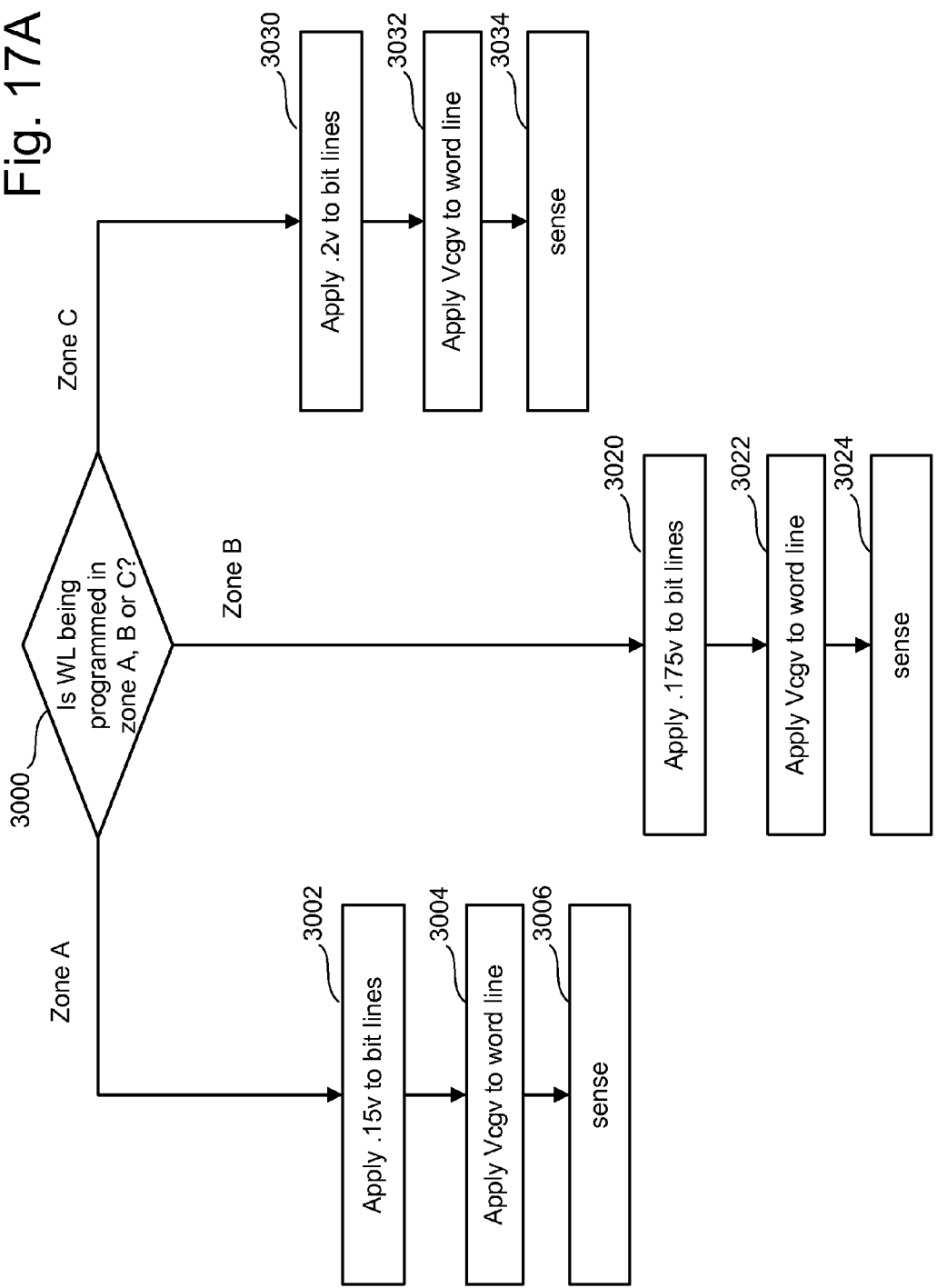

BIT LINE AND COMPARE VOLTAGE MODULATION FOR SENSING NONVOLATILE STORAGE ELEMENTS

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Typically, the program voltage (Vpgm) is applied to the control gates of the memory cells as a series of pulses. The magnitude of the pulses is increased with each successive pulse by a predetermined step size (e.g. 0.2 v, 0.3 v, 0.4 v, or others). In the periods between the pulses, verify operations are carried out. That is, the programming level of each memory cell of a group of memory cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising their respective bit line voltage to stop the programming process for those memory cells. The above described techniques, and others described herein, can be used in combination with various boosting techniques to prevent program disturb and with various efficient verify techniques known in the art.

As mentioned above, verifying programming can be done by testing that the memory cell conducts when a certain compare voltage is applied to the control gate of the memory cell. The same holds true for read operations. In many systems, a memory cell is considered conducting if the current conducted through the bit line connected to the memory cell exceeds a certain threshold amount. Earlier programmed word lines often see low bit line resistances during verify operations due to the fact that other word lines have not yet been programmed. The same is also sometimes true during read operations. As a result, when a compare voltage in excess of the threshold voltages of the memory cells connected thereto is applied to lower word lines, the memory cells often conduct current in excess of the required amount of current necessary for detection. While this does not create a problem from a logic point of view, it can represent an excessive use of power.

BRIEF DESCRIPTION OF THE DRAWINGS

FIG. 6 is a flow chart describing one embodiment of a process for programming.

FIG. 7 is a flow chart describing one embodiment of a process for programming data into a block of memory cells.

FIGS. 16A-C are tables depicting exemplary schemes for adjusting bit line and compare voltages for sensing operations in accordance with the disclosed technology.

FIG. 17A is a flowchart describing one embodiment for performing verification.

DETAILED DESCRIPTION

When memory cells connected to first programmed word lines conduct current in excess of the required threshold during sensing operations, these memory cells waste power. One way to conserve power during verify operations is to reduce the bit line voltage during verify operations for these first programmer word lines, thus bringing the current conducted by these memory cells closer to the required threshold. However, during the corresponding read operations of the first programmed word lines, not changing the corresponding bit line voltages can sometimes lead to an apparent decrease in threshold voltage of the memory cells. In one example implementation, to compensate for this apparent decrease in threshold voltage, one or more of the read bit line voltage, verify compare voltage, and/or read compare voltage can be adjusted.

Figure 1:
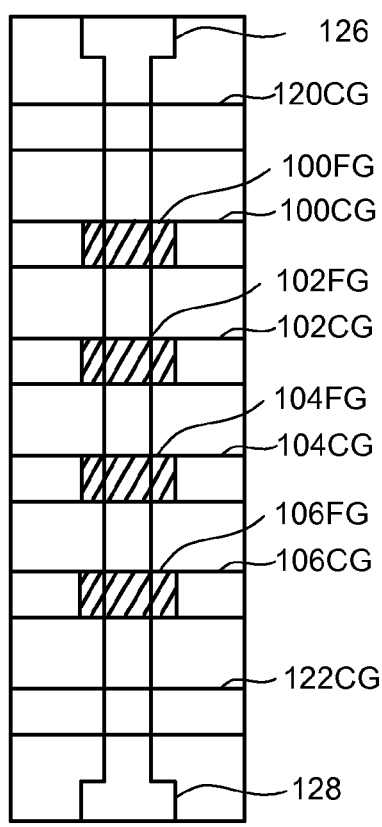
FIG. 1 is a top view of a NAND string.
Figure 2:
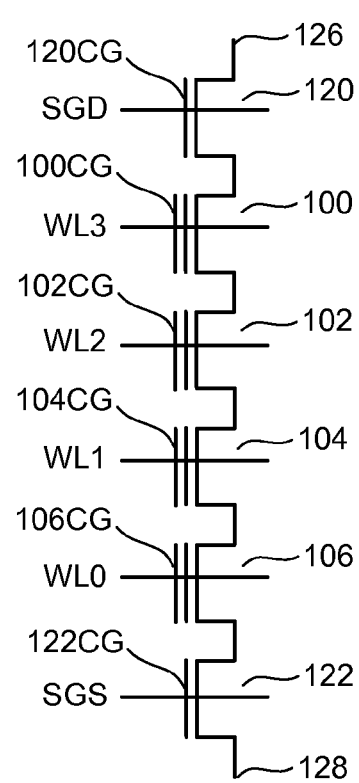
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
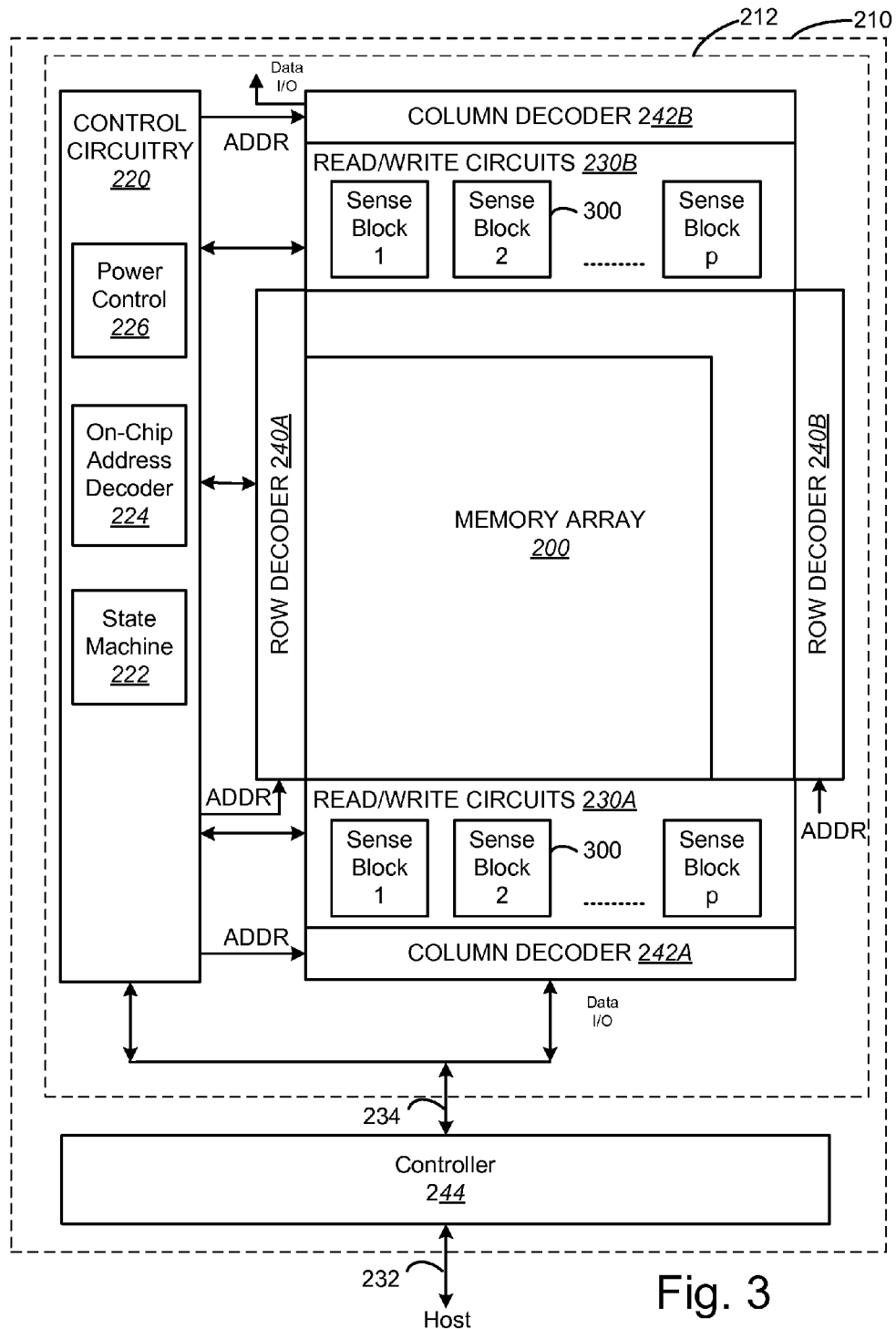
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
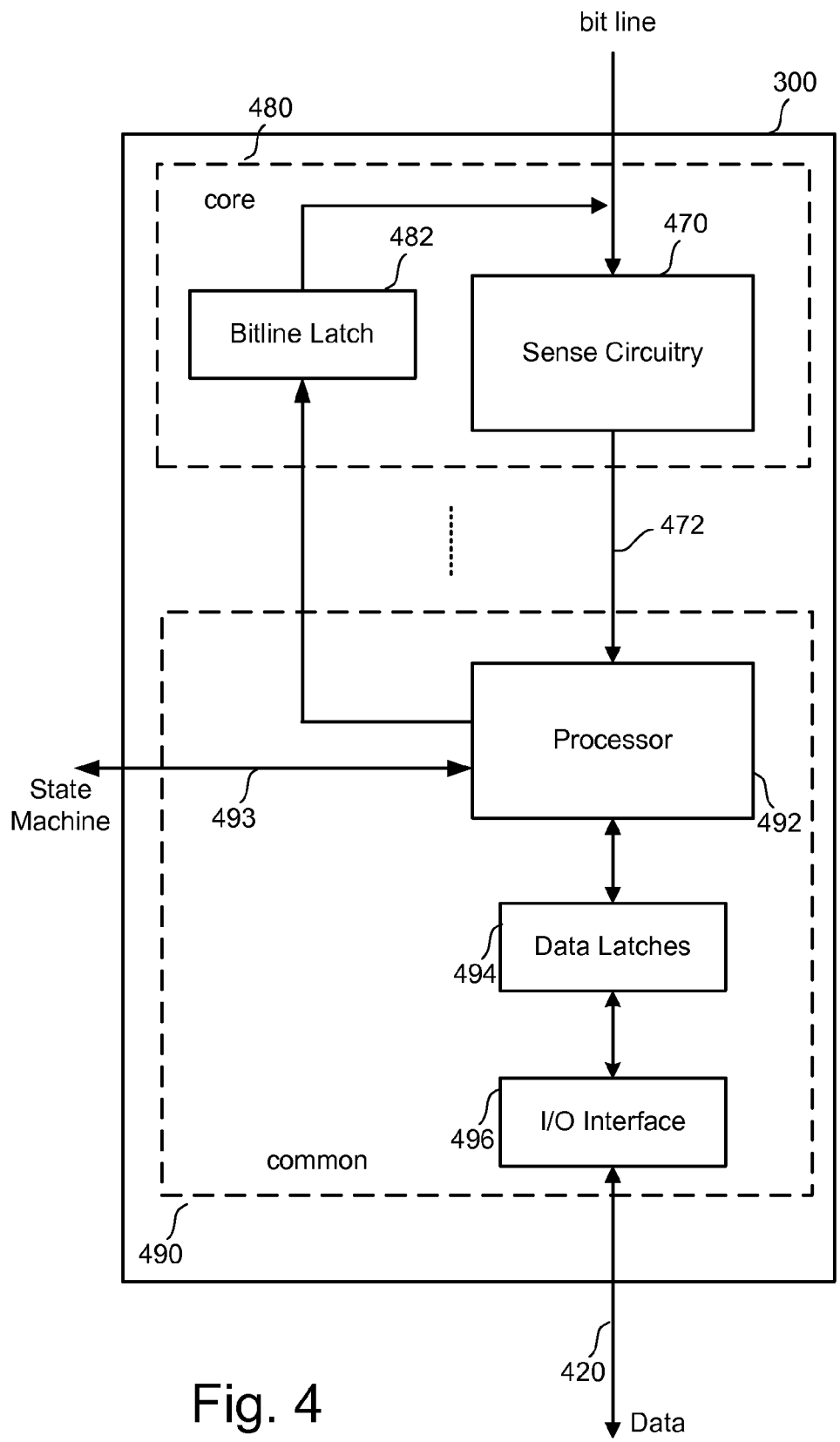
FIG. 4 is a block diagram of a non-volatile memory system.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
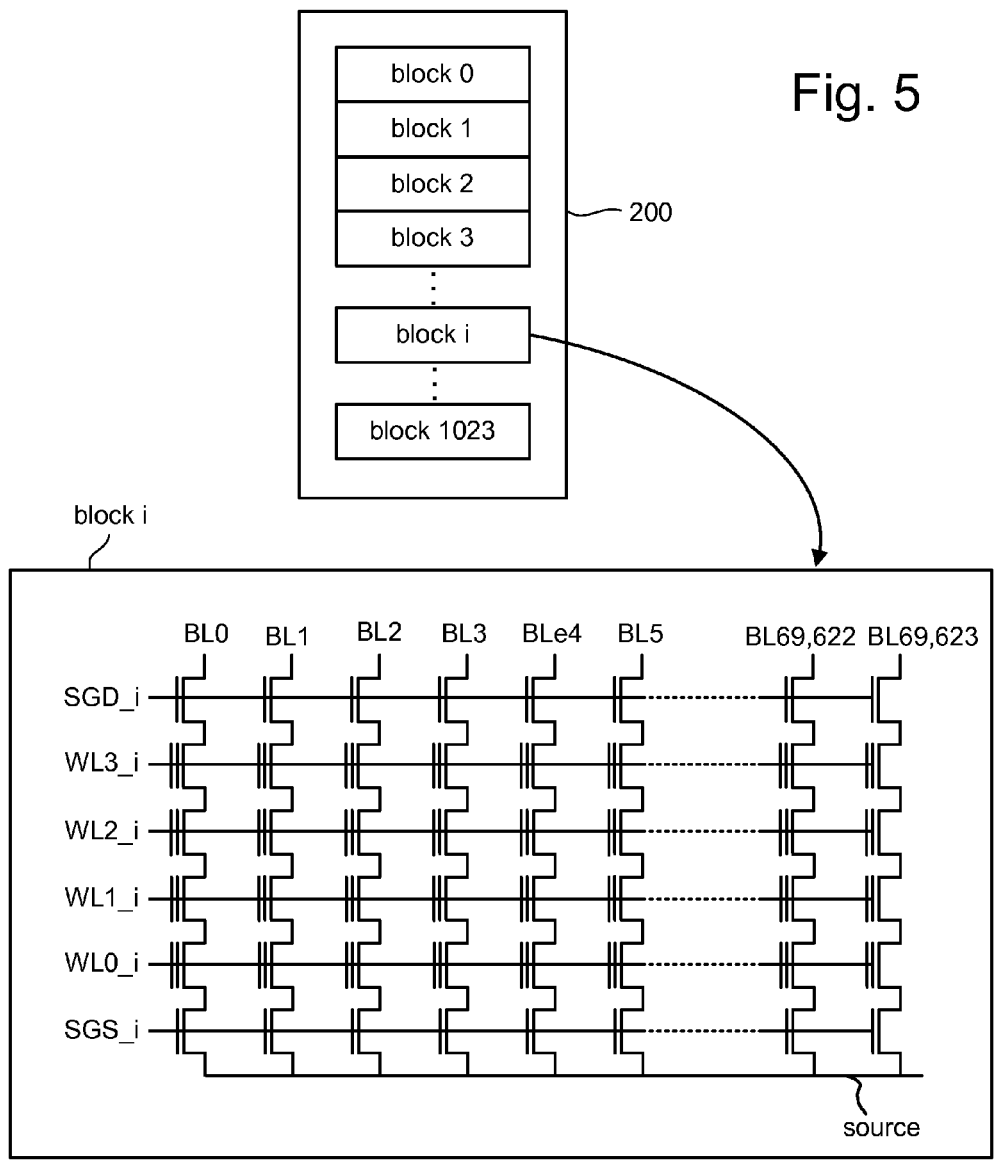
FIG. 5 depicts an exemplary structure of a memory cell array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associated with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for operating a non-volatile storage system. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
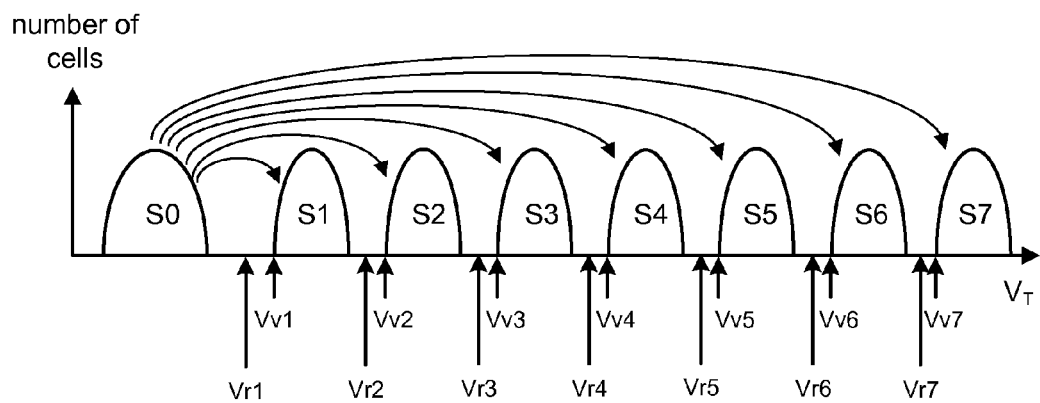
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
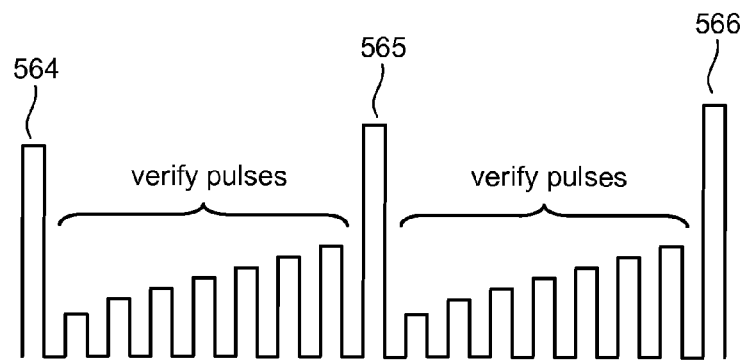
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

Figure 10A:
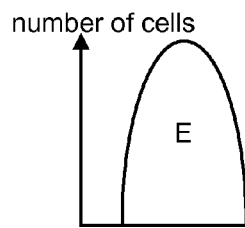
FIGS. 10A-E show various threshold voltage distributions and describe a process for programming non-volatile memory.
Figure 10B:
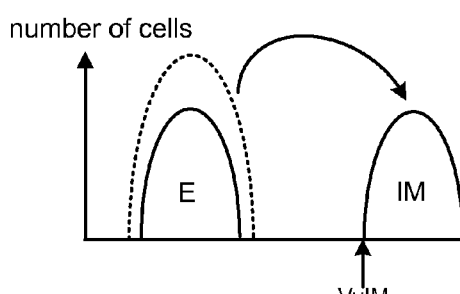

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
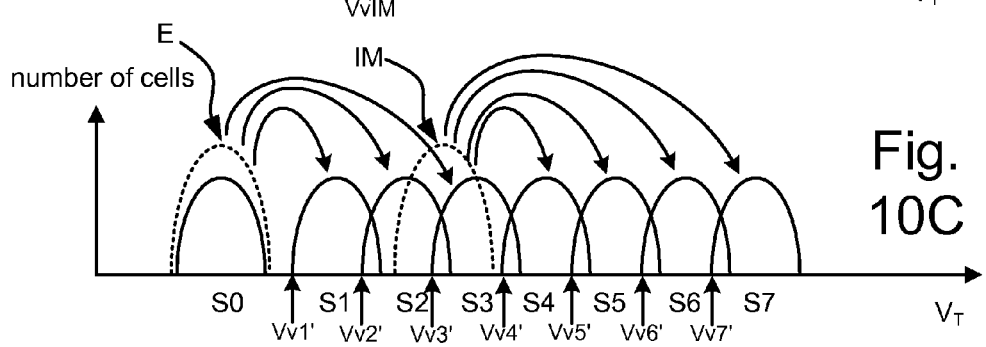
Figure 10D:
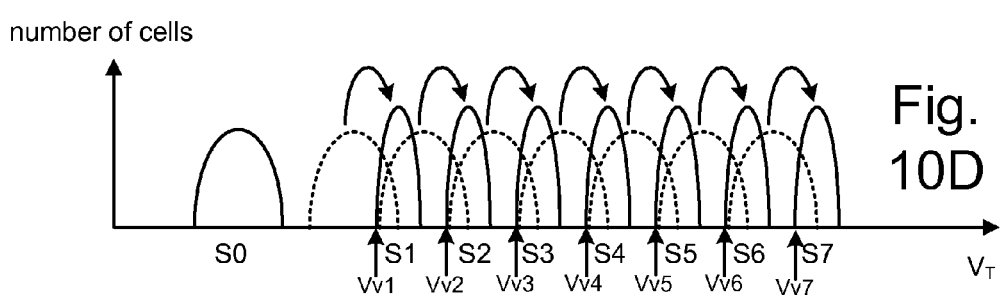
Figure 10E:
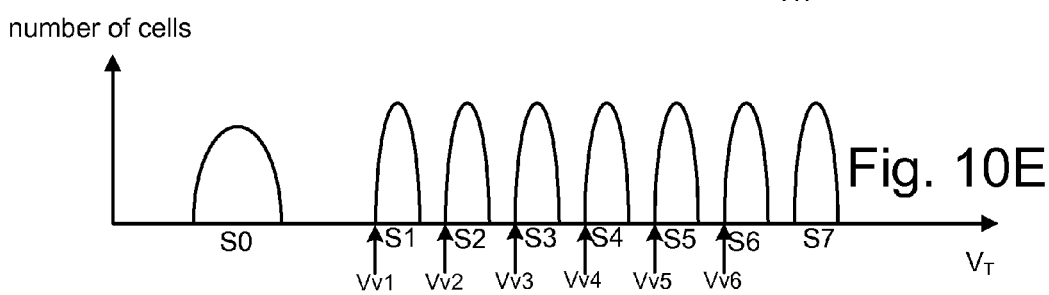

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
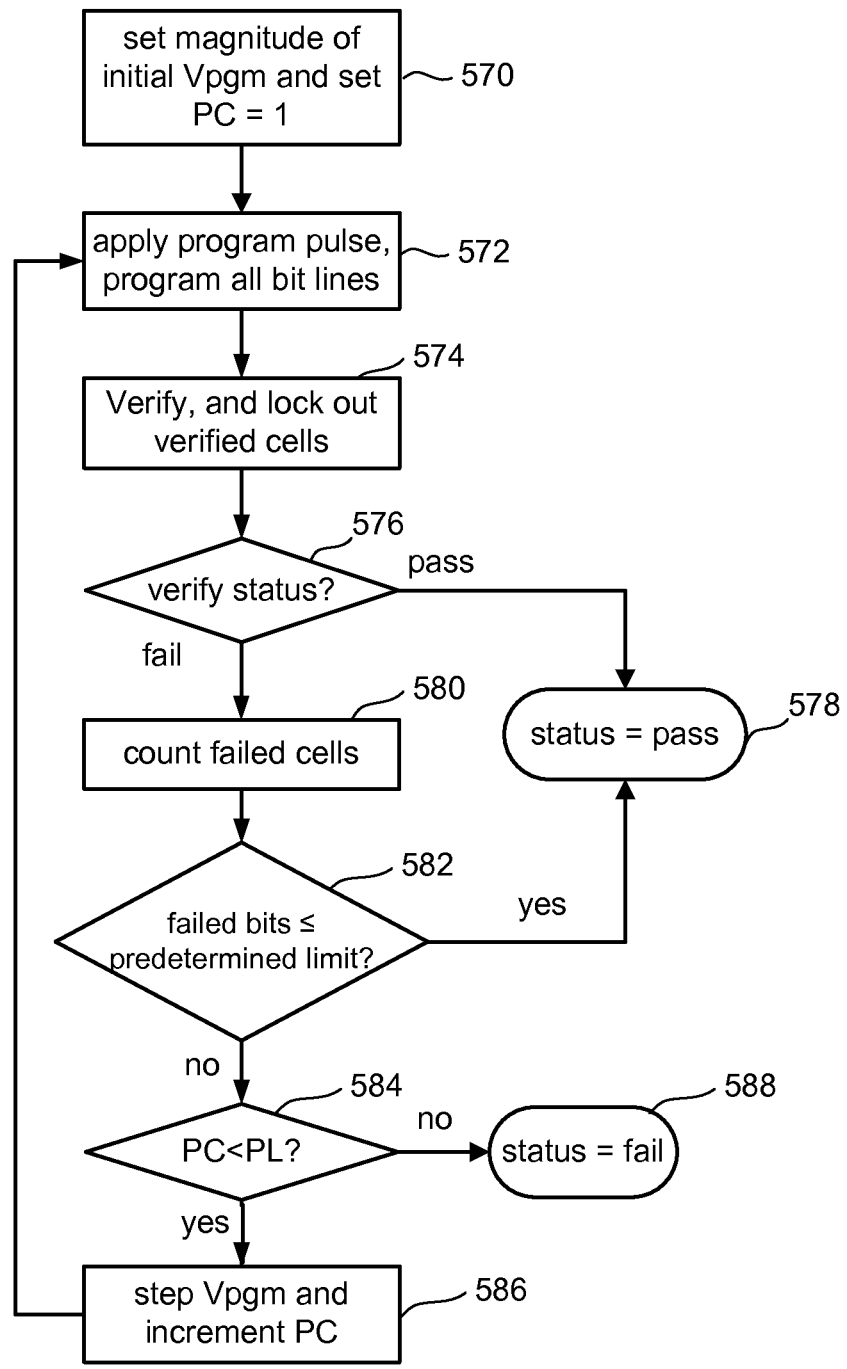
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification, as depicted (for example) in FIG. 9. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

When programming data to multiple states (e.g., rather than binary programming), it is important that the programming process be sufficiently precise so that the read process can unambiguously distinguish between the different threshold voltage distributions. For example, the tighter the threshold voltage distribution, the easier it is to unambiguously read the memory cells.

In one embodiment, the word lines can be programmed in order from source side (e.g., the side where the source line is) to drain side (e.g., the side where the bit line contact is). In one example, all pages of a word line are programmed prior to programming any pages of the next word line. In other example, some of the pages of a first word line are programmed, then some of the pages of the next word line are programmed, followed by completing programming one or more pages of the first word line, and so on.

Figures 12A, 12B:
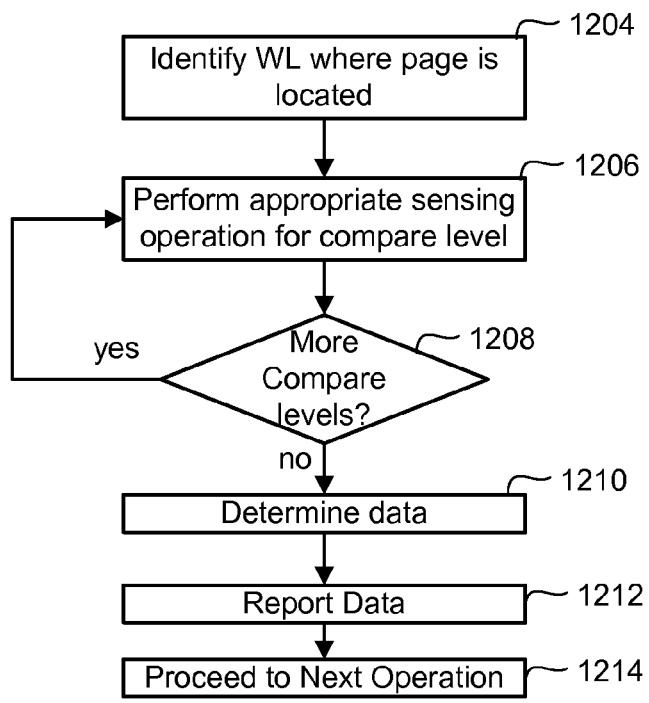
FIG. 12A is a table depicting one embodiment of a scheme for mapping pages of data to word lines in a block.
FIG. 12B is a flow chart depicting one embodiment of a method of reading pages of data from a block.

FIG. 12A depicts one example of another example of order for programming the pages of a set of memory cells in a block. The table provides the order for programming with respect to four word lines (WL0, WL1, WL2 and WL3) in the same block; however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, followed by the third page of WL0, followed by the first page of WL3, followed by the second page of WL2, followed by the third page of WL1, etc.

FIG. 12B is a flow chart depicting one embodiment of a process for reading one page of data from a block. The process of FIG. 12B can be performed as [part of step 526 of FIG. 6. In one example, the system can received a request from a host to read data. In response to the request, the system will determine the pages storing the requested data and perform the process of FIG. 12B for each page. In another embodiment, the system will receive a request for a specific page of data and perform the process of FIG. 12B in response thereto.

In step 1204 of FIG. 12B, the system identifies the word line in which the requested page is located. In step 1206, the system performs an appropriate sensing operation for a compare level (e.g., Vr1, Vr2, Vr3, ... of FIG. 8). For example in a system that stored three bits per memory cell, with the left most bit being in a first page, the middle bit being in a second page and the right bit being in a third page, the data may be encoded as follows:, S0=111, S1=110, S2=101, S3=100, S4=011, S5=010, S6=001 and S7=000. In such an example, in order to read the first page, step 1208 would include sensing at Vr4 of FIG. 8. To determine the data in the second page, the system would need to sense at Vr2, Vr4, and Vr6.

In some embodiments, performing the sensing operation of step 1206 entails determining the appropriate bit line voltage for the data state, determining the appropriate read compare voltage for the data state, applying the appropriate bit line and read compare voltages, and sensing the current through the memory cells connected to the word line.

In step 1208, the system determines whether there are any compare values for which the word line must be sensed in order to recover the requested page. If so, the system returns to step 1206. Otherwise, the system proceeds to step 1210 in order to determine the requested data from the results of the iterations of sensing operations of step 1206. In step 1212, the system reports the data (to the host, for example) determined in step 1210. In step 1214, the system proceeds to the next operation. In some embodiments, this next operation is another iteration of the process of FIG. 12 as described herein.

Figure 13:
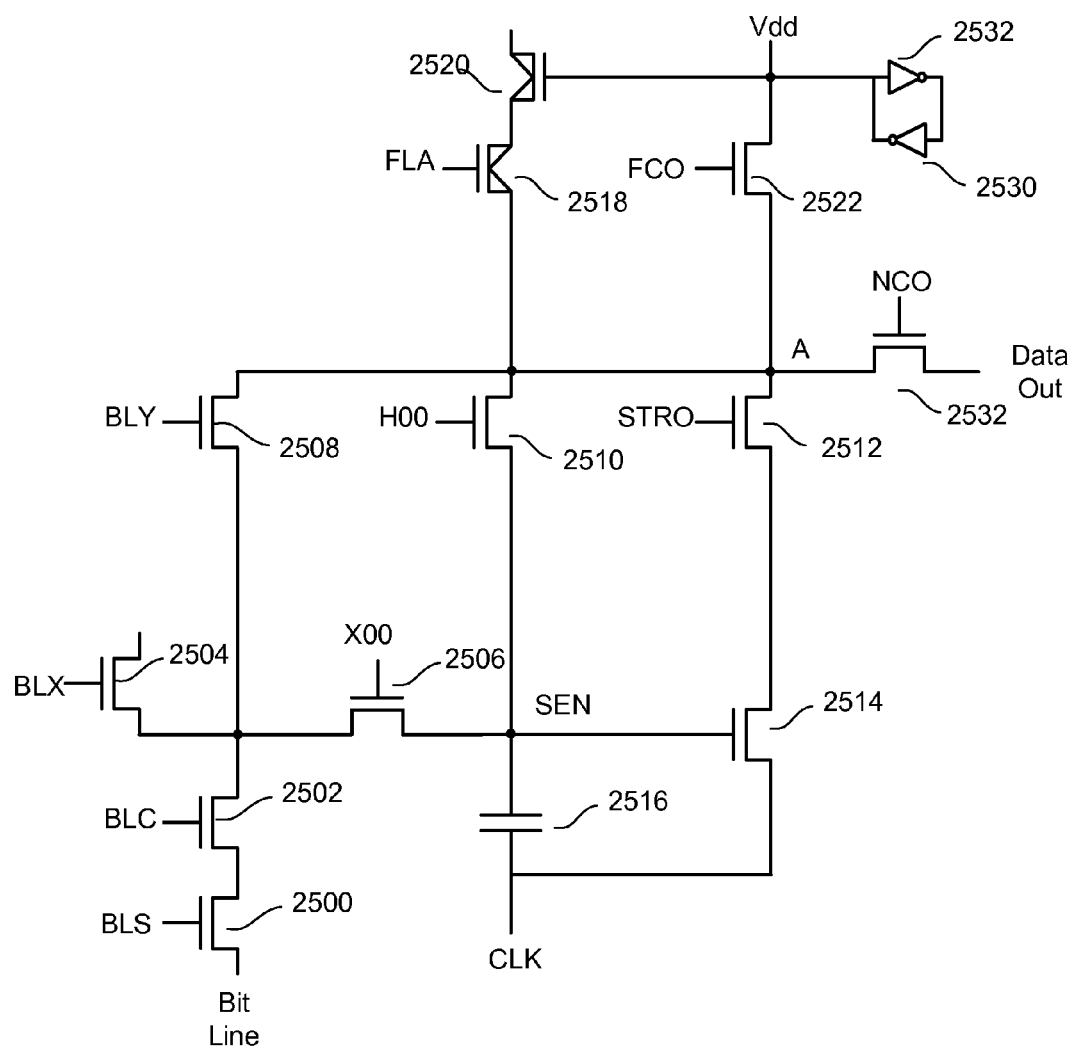
FIG. 13 is a schematic diagram of one embodiment of sense circuitry.

FIG. 13 is a schematic diagram depicting a circuit from sense circuitry 470 (see FIG. 4). As described below, the circuit of FIG. 13 will pre-charge a capacitor (or other charge storage device) to a pre-charge magnitude, discharge the capacitor through the memory cell for a strobe time, and sense voltage at the capacitor after the strobe time. The strobe time and/or the pre-charge magnitude can be based on the position of the memory cell being sensed with respect to the sense amplifier. Though FIG. 13 features one capacitor, in some embodiments, any suitable charge storage device can replace or complement this capacitor. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described above. FIG. 13 shows transistor 2500 connected to the Bit Line and transistor 2502. Transistor 2500 receives the signal BLS at its gate, and is used to connect to or isolate the Bit Line. Transistor 2502 receives the signal BLC at its gate, and is used as a voltage clamp. The gate voltage BLC is biased at a constant voltage equal to the desired Bit Line voltage plus the threshold voltage of transistor 2502. The function of transistor 2502, therefore, is to maintain a constant Bit Line voltage during a sensing operation (during read or verify), even if the current through the Bit Line changes. As will be shown later, in some embodiments of the disclosed technology, BLC is subject to adjustment in order to vary the bit line voltage according to the programmed state of the block and/or the location of the word line being sensed with respect to the source select line.

Transistor 2502 is connected to transistors 2504, 2506 and 2508. Transistor 2506 is connected to capacitor 2516 at the node marked SEN. The purpose of transistor 2506 is to connect capacitor 2516 to Bit Line 2500 and disconnect capacitor 2516 from Bit Line 2500 so that capacitor 2516 is in selective communication with Bit Line 2500. In other words, transistor 2506 regulates the strobe time mentioned above with respect to step 856. That is, while transistor 2506 is turned on capacitor 2516 can discharge through the Bit Line, and when transistor 2506 is turned off capacitor 2516 cannot discharge through the Bit Line.

The node at which transistor 2506 connects to capacitor 2516 is also connected to transistor 2510 and transistor 2514. Transistor 2510 is connected to transistors 2508, 2512 and 2518. Transistor 2518 is also connected to transistor 2520. Transistors 2518 and 2520 are PMOS transistors while the other transistors of FIG. 25 are NMOS transistors. Transistors 2510, 2518, and 2520 provide a pre-charging path to capacitor 2516. A voltage (e.g. Vdd or other voltage) is applied to the source of transistor 2520. By appropriately biasing transistors 2510, 2518 and 2520, the voltage applied to the source of transistor 2520 can be used to pre-charge capacitor 2516. After pre-charging, capacitor 2516 can discharge through the Bit Line via transistor 2506 (assuming that transistors 2500 and 2502 are conducting).

The circuit of FIG. 13 includes inverters 2530 and 2532 forming a latch circuit. The output of inverter 2532 is connected to the input of inverter 2530 and the output of inverter 2530 is connected to the input of inverter 2532. as well as transistors 2520 and 2522. The input of inverter 2532 will receive Vdd and the two inverters 2530, 2532 will act as a latch to store Vdd. The input of inverter 2532 can also be connected to another value. Transistors 2512 and 2522 provide a path for communicating the data stored by inverters 2530 and 2532 to transistor 2514. Transistor 2522 receives the signal FCO at its gate. Transistor 2512 receives the signal STRO at its gate. By raising or lowering FCO and STRO, a path is provided or cut off between the inverters 2530, 2532 and transistor (sensing switch) 2514. The gate of transistor 2514 is connected capacitor 2516, transistor 2506 and transistor 2510 at the node marked SEN. The other end of capacitor 2516 is connected to the signal CLK.

As discussed above, capacitor 2516 is pre-charged via transistors 2510, 2518 and 2520. This will raise the voltage at the SEN node to a pre-charge voltage level (Vpre). When transistor 2506 turns on, capacitor 2516 can discharge its charge through the Bit Line and the selected memory cell if the threshold voltage of the memory cell is below the voltage level being tested for. If the capacitor 2516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 2514 is on (conducting). Since transistor 2514 is on during the strobe time, then transistor 2512 should be off. If the capacitor does not discharge during the strobe time, then the voltage at the SEN node will remain above the threshold voltage of transistor 2514 and the charge at the inverters 2530, 2532 can be discharged into the CLK signal when STRO turns on transistor 2512. If the capacitor discharges sufficiently during the strobe time, then the voltage at the SEN node will decrease below the threshold voltage of transistor 2514; thereby, turning off transistor 914 and the data (e.g., Vdd) stored at inverters 2530, 2532 from being discharged through CLK. So testing whether the diodes 2530, 2532 maintain their charge or discharge will indicate the result of the verification process. In one embodiment, the result can be read at node A via transistor 2534 (Data Out) by turning on transistor 2534 gate signal NCO.

The pre-charge level of capacitor 2516 (and, thus, the pre-charge voltage at node SEN) is limited by the current passing through transistor 2510. The current that passes through transistor 2510 is limited by the gate voltage H00. As such, the pre-charge voltage at node SEN is limited by the voltage H00 less the threshold voltage of transistor 2510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read operation, the voltage applied to the control gate of the cell may cause the channel (connected to the bit line) of the cell to conduct. If this happens, a capacitor is discharged through the channel, lowering in voltage as it discharges.

Figure 14:
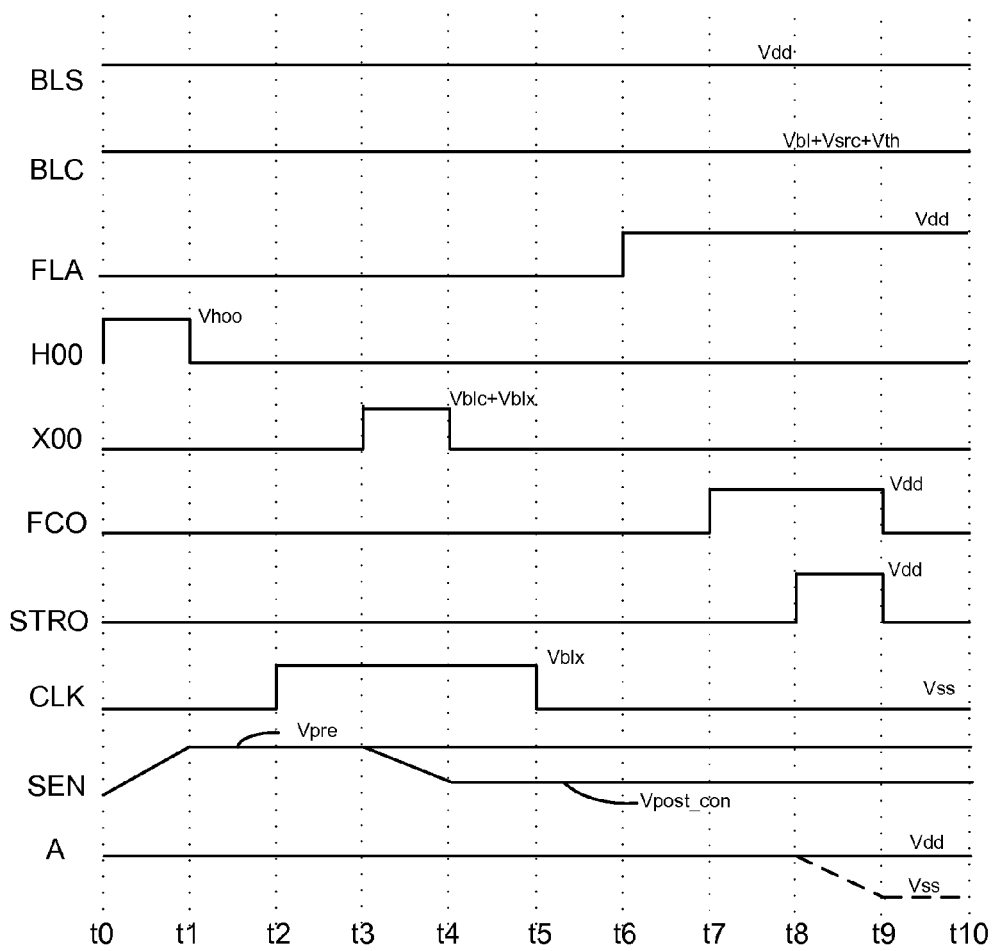
FIG. 14 is a timing diagram that describes the behavior of signals depicted in FIG. 13.

FIG. 14 is a timing diagram describing the behavior of various signals from FIG. 13. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 902. The signal FLA starts at Vss at t0 and goes to Vdd at T6. When the signal FLA is at Vss, the pre-charging path is regulated by transistor 2510. At t0, the voltage of H00 is raised to a pre-charge level. The raising of the voltage at H00 turns on transistor 2510 and opens up the pre-charge path. The magnitude of the voltage at H00 is set. FIG. 14 shows H00 going to Vhoo. Note that in some embodiments, the circuit of FIG. 13 can respond to more than one voltage magnitude for H00. For example, in one embodiment, the output of the circuit of FIG. 13 is linear function with respect to position of the memory cell being sensed so that there are many different possible voltage magnitudes for H00, depending on position of the memory cell being sensed. The signal H00 will stay at the pre-charge voltage (Vhoo) until time t1. While H00 is high, transistor 2510 turns on and capacitor 2516 will pre-charge between T0 and T1, as depicted by the voltage at SEN (depicted second from the bottom on FIG. 14). At time t1, H00 is brought down to Vss and the pre-charging is completed.

The signal X00 is used to allow capacitor 2516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, capacitor 2516 will be in communication with the Bit Line in order to allow it to discharge as charged through the Bit Line and the selected memory cell (depending on the threshold voltage of the selected memory cell). The signal CLK is raised to Vblx at time t2 and lowered back down to Vss at time T5 to prevent any fighting conditions in the circuit and to allow proper discharge of capacitor 2516.

As discussed above, because H00 is raised between t0 and t1, capacitor 2516 (and SEN node) will charge up between t0 and t1 (the pre-charge). This is depicted in FIG. 27 with the SEN node charging from Vss to Vpre. The solid line for Vpre represents an example pre-charging of the node SEN (and capacitor 2516) in response to Vh00 being applied to the gate of transistor 2510.

When X00 is raised up at t3, capacitor 2516 can discharge through the Bit Line (if the threshold voltage is at the appropriate level). As depicted in FIG. 27 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 2516 will not discharge and the voltage will remain at Vpre. The period between t3 and t4 is the strobe time and can be adjusted, as described above.

FIG. 14 shows that the signal FCO is raised to Vdd at t7 and lowered to Vss at T9. The signal STRO is raised to Vdd at t8 and lowered at t9. Between times t8 and t9, there is a path between the inverters 2530, 2532 and transistor 2514. If the voltage at the node SEN is greater than the threshold voltage of transistor 2514, then there will be a path from the inverters 2530, 2532 to CLK and the data at the inverters 2530,932 will dissipate through the signal CLK and through the transistor 2514. If the voltage at the node SEN is lower than threshold voltage of transistor 2514 (e.g. if the capacitor discharged), then transistor 2514 will turn off and the voltage stored by the inverters 2530, 2532 will not dissipate into CLK. FIG. 14 shows the voltage level at A at Vdd. If the voltage of the capacitor does not dissipate (e.g., due to not enough current flowing because the threshold voltage of the selected memory cell is greater than the voltage being tested for), then transistor 2514 will remain on and the voltage at node A will remain dissipate to Vss (as depicted by the dashed line). If the voltage of the capacitor does dissipate (e.g., due to sufficient current flowing because the threshold voltage of the selected memory cell is below the voltage being tested for), then transistor 2514 will turn off and the voltage at node A will remain at Vdd (as depicted by the solid line). The output of node A is provided to the Data Out signal via transistor 2534 by applying Vdd to the signal NCO.

Figure 15:
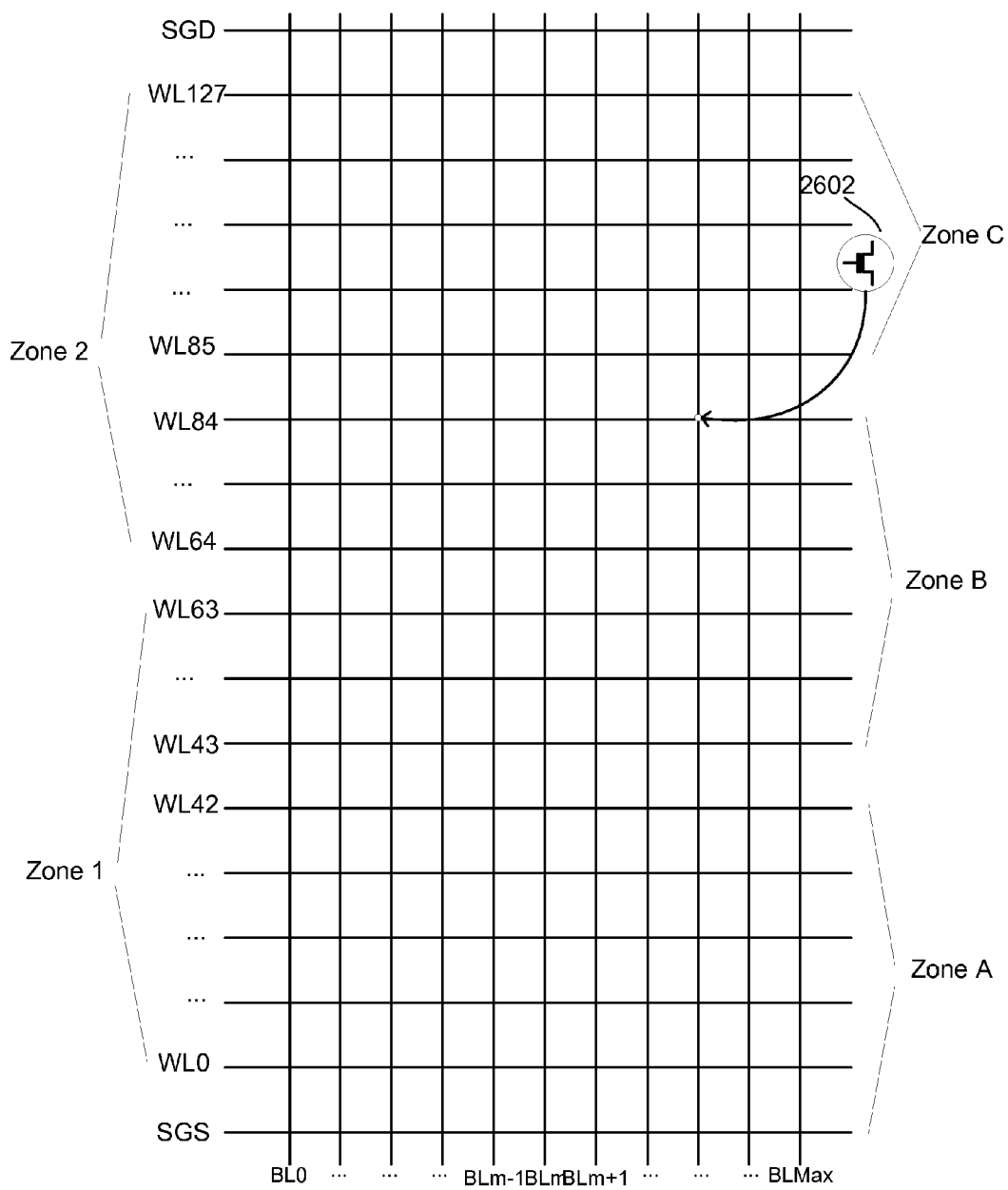
FIG. 15 is a grid representing the word lines and bit lines in one example of a block.

FIG. 15 depicts a grid of memory cells in a block. As shown, the vertical lines represent the bit lines in the block, which are indexed from BL0 to BLMax, wherein BLMax is the last bit line. The horizontal lines represent the word lines in the block, and are indexed from WL0 (the word line closest to SGS, the source select line) to WL127 (the word line closest to SGD, the drain select line). Though 128 word lines are depicted for FIG. 15, one of ordinary skill in the art will appreciate that the concepts explained herein can apply to a lesser or greater number of word lines. Element 2602 is a memory cell, and a memory cell lies at the intersection of each word line and bit line.

Because word lines are programmed from the source side (SGS) to the drain side (SGD), meaning from WL0 to WL127, when lower word lines (i.e. those word lines closer to SGS that are programmed earlier) are programmed, the memory cells connected thereto see less bit line resistance during verify operations than the memory cells connected to higher word lines (i.e. the word lines closer to SGD that are programmed later). Since memory cells connected to lower word lines see a low bit line resistance, they tend to conduct more current than needed to appropriately dissipate the charge stored on capacitor 2516. While the extra current does not cause an error, it does waste power. In order to save power, the average current can be reduced for these memory cells.

One way to reduce the current that flows through memory cells during sensing operations is to lower the bit line voltage during sensing operations for lower word lines. In some embodiments, the bit line voltage can also depend on the data state being sensed. In principle, a different bit line voltage may be applied for sensing each combination of word line and data state. The word lines in a block can also be divided into zones in order to simplify a scheme for differentiating bit line voltages for word lines. Two among many possible divisions of word lines into zones are shown in FIG. 15. In one example, implementation (on the left side of FIG. 15), the block is shown to be divided into Zone 1 (WL0-WL63) and Zone 2 (WL64-WL127). Lower bit line voltages will be applied when sensing memory cells connected to word lines in Zone A compared to bit line voltages applied when sensing memory cells connected to word lines in Zone B.

In another example implementation (the right side of FIG. 15), the block is shown to be divided into Zone A (WL0-WL42), Zone B(WL43-WL84) and Zone C (WL85-WL127). When verifying memory cells connected to word lines in Zone A, a first set of one or more bit line voltages are applied. When verifying memory cells connected to word lines in Zone B, a second set of one or more bit line voltages are applied. When verifying memory cells connected to word lines in Zone C, a third set of one or more bit line voltages are applied. The voltages of the second set of one or more bit line voltages are less (in voltage magnitude) than the voltages of the third set of one or more bit lines voltages. The voltages of the first set of one or more bit line voltages are less (in voltage magnitude) than the voltages of the second set of one or more bit lines voltages. In one embodiment, the first, second and third sets of bit lines voltages are only one voltage each. However, in other embodiments, each set can includes a variety of bit line voltages.

FIG. 16A depicts example voltages applied to the bit lines for the embodiment of FIG. 15 that implements Zone A, Zone B and Zone C. Current schemes apply the same voltage (by way of example only, 0.2V) to the bit lines, regardless of the location of the memory cells being sensed, as depicted under the column labeled "Current." According to the disclosed technology, the voltage applied to the bitline during verify operations varies based on the zone to which the word line being sensed belongs. As shown by the column labeled "Proposed," 0.15V is a voltage applied to the bit lines during verify operations to memory cells connected to word lines in Zone A, 0.175V is applied to the bit lines during verify operations for memory cells connected to word lines in Zone B, and 0.2V is applied to the bit lines during verify operations for memory cells connected to word lines in Zone C. Under this scheme, during read operations, the voltages applied to bit lines during read operations (e.g., 0.2 v) may differ from at least the bit line voltages applied to memory cells in Zone A during verify operations. For example, bit line voltages for zone A may be at a standard value of 0.2V during read operations and 0.15 volts during verify operations. The numerical values in FIG. 16A, as elsewhere, are only illustrative.

Suppose the above (or similar) scheme is used during a sequence of programming operations in a block. When reading back the same memory cells in lower zones, if a relatively high bit line voltage (i.e. 0.2V) is used, then the current conducted through these memory cells may be higher than what was conducted during the corresponding verify operation. As a result, the threshold voltages during the read operation may appear to be shifted down, since current through the bit line also rises and falls with the magnitude of the word line voltage above the threshold voltage. In order to make sure the power saving goals of the above scheme are met without introducing potential errors into sensing operations, at least a few options are available. One option is that, without changing the bit line voltage during the read operation, the system can lower the read compare voltage by an offset in order to match the apparent downward shift in threshold voltage during the read operation. More detail is provided for this option below. Another option is that, without changing the bit line voltage during the read operation, the system can raise the verify compare voltage (Vcgv) applied to the word lines in the lower zones, thereby compensating for the threshold voltages that will appear to be shifted down during the read operation. A possible implementation of this scheme is shown in FIG. 16B. Here, the bit line voltages are the same as in FIG. 16A, but the read compare voltages are different, depending on the zone. Since the threshold voltage does not appear shifted down when reading in Zone C, a standard Vcgv for a given data state may be applied when verifying programming in Zone C. Standard Vcgv values may include Vv1, Vv2, Vv3, Vv4, Vv5, Vv6, and Vv7 of FIG. 8, as appropriate for the current sensing operation(s). In Zone A, the threshold voltage may appear shifted during a read operation. Thus, to compensate, an offset of Δ1 is added to Vcgv. For example, Δ1 may be 25 mV. This offset may take other values as well. In Zone B, a smaller offset Δ2 (e.g., 15 mV) is added to Vcgv since the change in bit line voltage is smaller than compared to zone A. In some embodiments, it may be appropriate to both lower the read compare voltage and increase the verify compare voltage for word lines in lower zones.

Another option involves implementing the scheme of FIG. 16B for verify operations, and additionally adjusting read compare voltages (Vcgr) and bit line voltages during read operations, as shown in FIG. 16C. Standard Vcgr values may include Vr1, Vr2, Vr3, Vr4, Vr5, Vr6, Vr7, and Vr8, but an offset may be added or subtracted to these values in order to properly account for apparent threshold voltage shifts. The column of FIG. 16C labeled "Current Vbl" indicates that in previous implementations, the same voltage (for example, 0.2V) would be applied to bit lines during read operations. The columns under the header "Proposed Vbl" of FIG. 16C show how these bit line voltages may be changed according to the disclosed technology. As explained before, bit line resistance depends on and changes with the degree to which the block has been programmed. As such, the adjusting of compare voltages and bit line voltages during read operations should account for the degree to which the block has been programmed.

In one embodiment, the degree to which the block has been programmed is measured by the number of word lines that have been subjected to programming (ie how many word lines have been programmed). In one embodiment, rather than tracking the exact number of word lines, the system can instead determine whether all of a zone has been programmed. In FIG. 16C, the row labeled "Max Pgm WL" shows one way of deciding how to adjust bit line and read compare voltages. The entry labeled "≤WL42" applies to the case in which the highest programmed word line is lower than or equal WL42. As shown in the corresponding column, since these word lines are all in Zone A, the memory cells connected thereto will see a low bit line resistance and correspondingly require a low bit line voltage (for example, 0.15V instead of 0.2V) in order to conduct an adequate amount of current. Additionally, in order to account for any apparent threshold voltage shift, the read compare voltage is offset by Δ1.

Similarly, under the column ">42 & ≤84", which means that the highest programmed word line is in Zone B, bit line voltages and compare voltages for read operations in Zones A and B are set. Since more word lines have been programmed, the bit line resistance seen by memory cells being sensed is higher. As such, the bit line voltages are somewhat higher (0.175) for word lines being read in Zones A and B. In one embodiment, word lines in Zones A and B see a different apparent threshold voltage shift, Additionally, in order to account for any apparent threshold voltage shift, the read compare voltage is offset by Δ2.

In some embodiments, the offset varies depending on the data state being sensed.

The column with the top row entry of ">WL84," corresponds to the situation where the highest programmed word line is in Zone C. In this case, during the read operation, for all zones, reading is performed with bit line voltages at 0.2 v (the standard bit line voltage) and the standard Vcrgr (e.g., Vr1, Vr2, Vr3, ... of FIG. 8).

The embodiments discussed above include (among others) performing verify using the voltages of FIG. 16B and standard read operations, performing verify using the voltages of FIG. 16B and varying the read operations, and performing verify using the voltages of FIG. 16B and performing read operations using the voltages of FIG. 16C.

FIG. 17A is a flowchart describing one embodiment of a process for performing verification based on the embodiment associated with the table depicted in FIG. 16A. The process of FIG. 17A is performed during step 574 of FIG. 11. Thus, each time a verify operation is being performed, the process of FIG. 17A would be performed. In step 3000, the system determines whether the word line being programmed (and verified) is in zone A, B or C. That is, whether the memory cells being programmed (and verified) are connected to a word line that is in zone A, B or C. If the word line being programmed is in zone A, then steps 3002-3006 are performed. If the word line being programmed is in zone B, steps 3020-3024 are performed. If the word line being programmed is in zone C, steps 3030-3034 are performed.

If the word line being programmed (and verified) is in zone A, then in step 3002 the system applies 0.15 volts to the bit lines. In step 3004, the appropriate Vcgv (e.g. Vv1, Vv2, Vv3, ... ) is applied to the word line being verified. In step 3006, a sensing operation is performed (as discussed above). Based on the sensing operation, it is determined whether the memory cells have been verified to reach their target state(s).

If the word line being programmed is in zone B, then in step 302 the system applies 0.175 volts to the bit lines. In step 3022, the appropriate Vcgv is applied to the word line. In step 3024, a sensing operation is performed for the memory cells. Based on this sensing operation, it is determined whether the memory cells have been verified to reach their target state(s).

If the word line being programmed (and verified) is in zone C, then in step 303 the system applies 0.2 v to the bit lines. In step 3032, the appropriate Vcgv is applied to the word line. In step 3034, a sensing operation is performed in response to the bit line voltage and word line voltage described above. Based on the sensing operation, it is determined whether the memory cells have been verified to reach their target state(s).

Figure 17B:
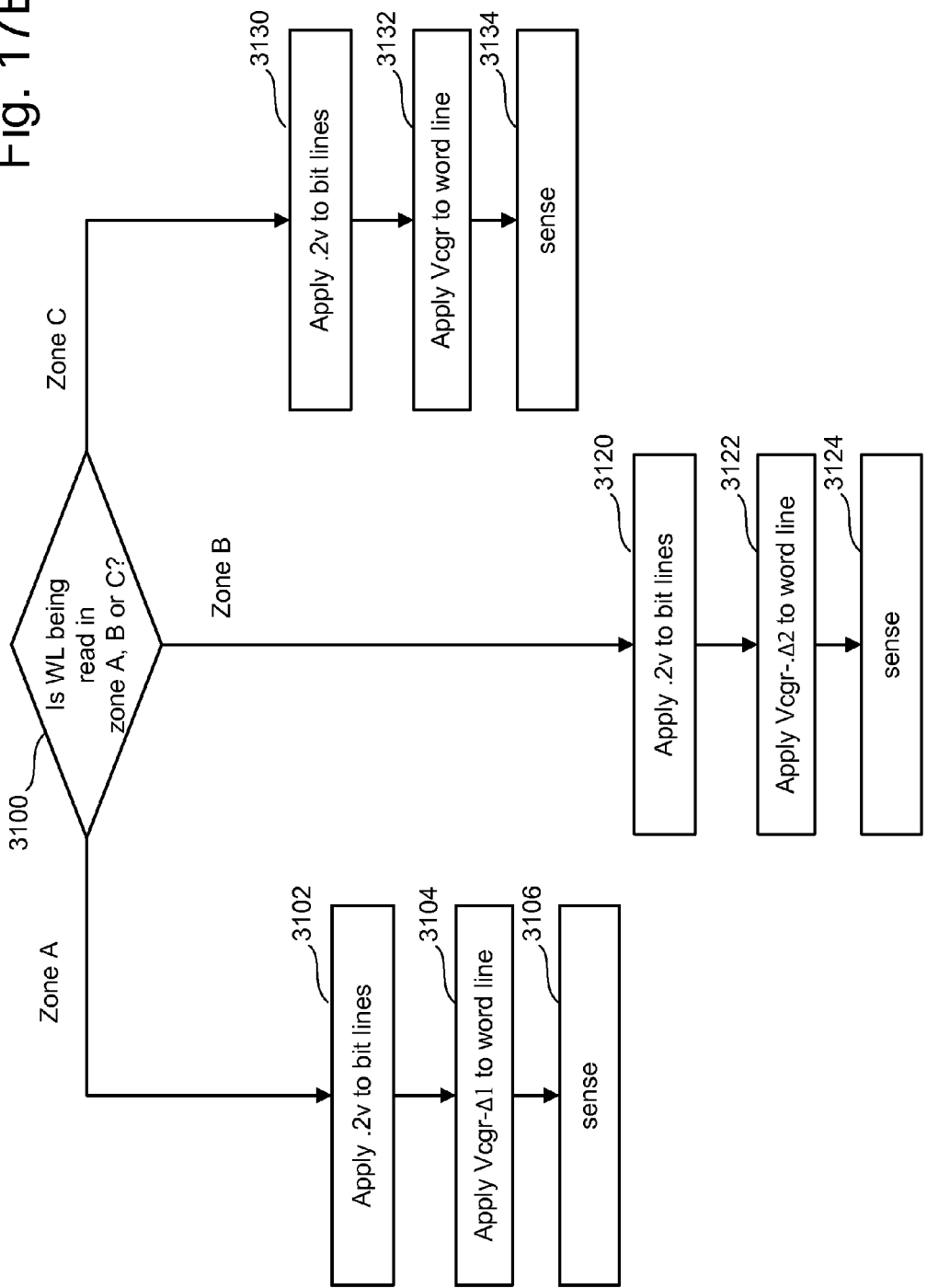
FIG. 17B is a flowchart describing one embodiment for performing a read process.

FIG. 17B is a flowchart describing one embodiment of a read operation associated with the embodiments of FIGS. 16A and 17A. The process of FIG. 17B would be performed during step 1206 of FIG. 12B. In this embodiment, verification is performed according to FIG. 17A and reading is performed according to FIG. 17B. In step 3100, the memory system determines whether the word line being read is in zone A, zone B or zone C. If the word line being read is in zone A, then in step 3102, then the system applies 0.2 v to the bit lines. In step 3104, a voltage is applied to the word line that is equal to Vcgr–Δ1. In step 3106, a sensing operation is performed for the memory cells connected to the word line selected for reading.

If the word line being read is in zone B, then in step 3120, the system applies 0.2 volts to the bit lines. A voltage is applied to the word line selected for reading, where the voltage is equal to Vcgr–Δ2. In step 3124, sensing operation is performed.

If the word line being read is in zone C, then in step 3130, the system applies 0.2 volts to the bit lines. In step 3132, the appropriate Vcgr is applied to the word line selected for reading. In step 3134, sensing operation is performed.

In the process of FIG. 17B, in some cases the voltage applied to the word lines selected for reading is lowered in order to compensate for apparent change in threshold voltage, as discussed above. For example, when the word line being read is in zone A or zone B, the reading of the memory cells connected to the word line that is selected for reading includes applying a read compare voltage for the particular data state that is different than the standard compare voltage that would be used for memory cells connected to a word line in zone C.

Since the processes of FIG. 17B is performed during step 1206 of FIG. 12B, it is likely (in some embodiments) that the process of FIG. 17B would be performed multiple times for different Vcgr values in order to obtain the appropriate data state.

Figure 18A:
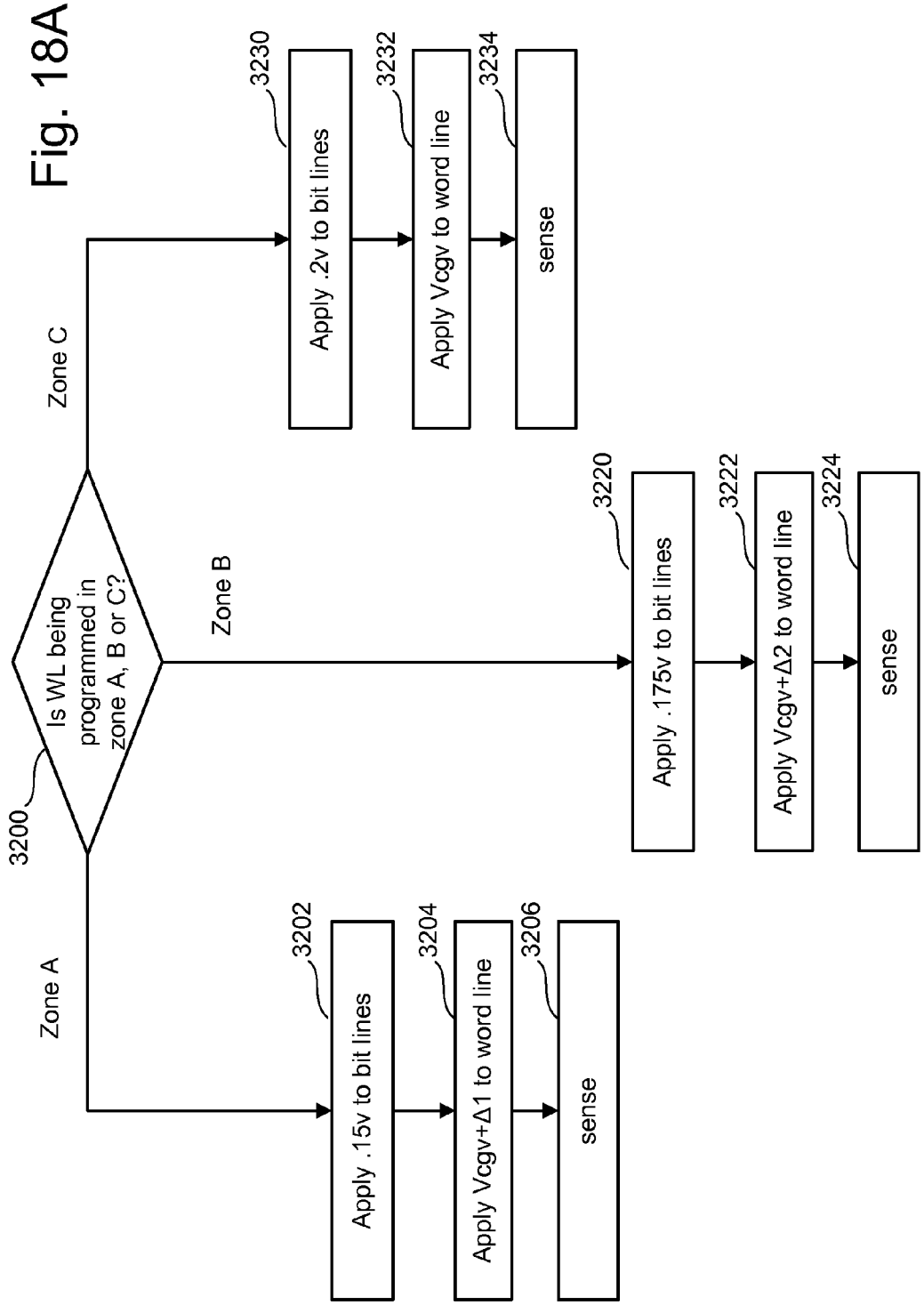
FIG. 18A is a flowchart describing one embodiment of a verification process.

FIG. 18A describes another embodiment for performing verify operation. The process of FIG. 18A is performed during step 574 of FIG. 11. Note also that FIG. 18A implements the embodiment associated with FIG. 16B. In step 3200 of FIG. 18A, the system determines whether the word line being programmed (and verified) is in zone A, zone B or zone C. If the word line being programmed (and verified) is in zone A, then in step 3202, the system applies 0.15 volts to the bit lines. In step 3204, a voltage is applied to the word line equal to the appropriate Vcgv+Δ1. In step 3206, a sensing operation is performed.

If the word line being programmed (and verified) is in zone B, then in step 3220, the system applies 0.175 volts to the bit lines. In step 3222, a voltage is applied to the word line equal to the appropriate Vcgv+Δ2. In step 3224, a sensing operation is performed.

If the word line being programmed (and verified) is in zone C, then 0.2 volts is applied to the bit lines. In step 3232, the appropriate Vcgv is applied to the word line. In step 3234, a sensing operation is performed in response to the bit line voltage and word line voltage mentioned above.

Figure 18B:
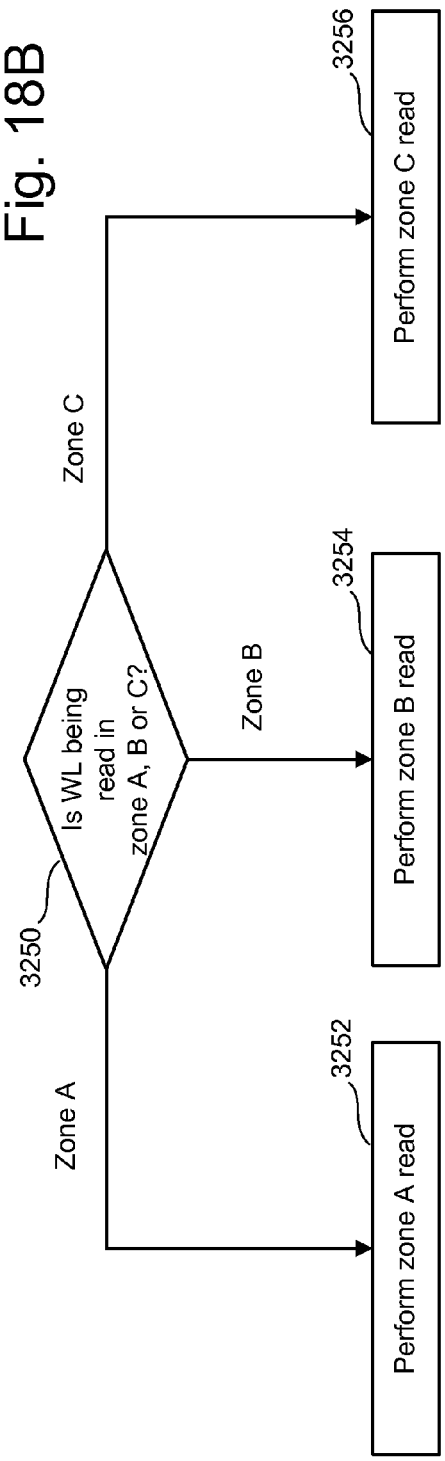
FIGS. 18B, 18C, 18D and 18E are flowcharts which collectively describe one embodiment of a process for reading.

FIG. 18B is a process for performing a read operation based on the embodiments of FIG. 16B and FIG. 16C. The process of FIG. 18B is performed during step 1206 of FIG. 12B. In one embodiment, verification is performed according to the embodiment of FIG. 18A and reading is performed according to the embodiment of FIG. 18B. In step 3250, the system determines whether the word line being read is in zone A, zone B, or zone C. If the word line is in zone A, then the system performs a zone A read process in step 3252. If the word line being read is in zone B, then the system will perform a zone B read process in step 3254. If the word line being read is in zone C, then the system will perform a zone C read process in step 3256.

Figure 18E:
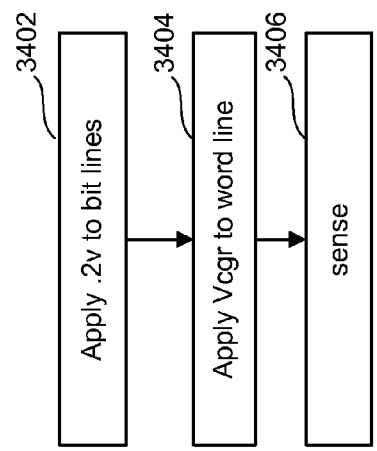
Figure 18C:
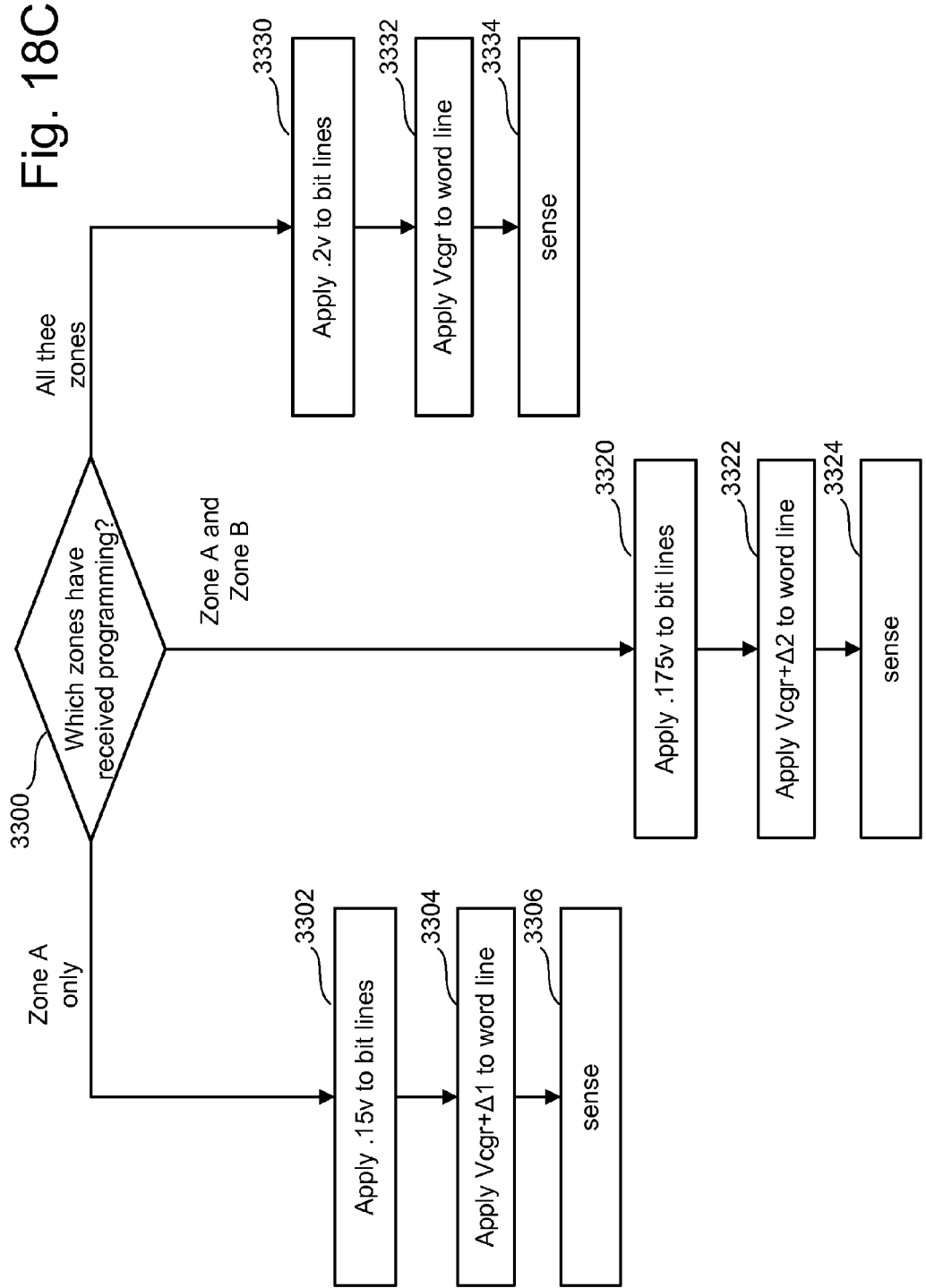

FIG. 18C is a flowchart describing one embodiment of the zone A read process of step 3252. That is, the process of FIG. 18C is performed when reading memory cells connected to word lines that are in zone A. In step 3300 of FIG. 18C, the system determines which zones of the block have already been programmed. For example, if only word lines WL1-WL42 (or some subset of those word lines) have been programmed, then only zone A has been programmed. If any of the word lines in zone B have been programmed (any of the word lines between WL43-84), then zone A and zone B have been programmed. If any of the word lines in zone C have been programmed (any of the word lines above WL84) then all three zones have received some programming. The test in one embodiment of step 3300 is not which zones have completed programming, but which zones have received some programming. If only word lines in zone A have received some programming, then the process continues to step 3302. If the word lines in zone A and zone B have received some programming, the process continues to step 3320. If word lines in all three zones have received programming, then the process continues to step 3330. Note that in other embodiments, the boundaries for the zones can be different than described above and the systems may have more or less than three zones.

If only zone A word lines have been programmed, then in step 3302, the system applies 0.15 volts to the bit lines. In step 3304, a voltage is applied to the word line equal to the appropriate Vcgr+Δ1. In step 3306, a sensing operation is performed for the memory cells connected to the word line selected for reading.

If word lines in zone A and zone B have received programming, then in step 3320, the system applies 0.175 volts to the bit lines. In step 3322, a voltage is applied to the word line equal to Vcgr+Δ2. In step 3324, a sensing operation is performed for the memory cells connected to the word line selected for reading.

If word lines in all three zones have received programming then 0.2 volts is applied to the bit lines in step 3330. The appropriate Vcgr is applied to the word line in step 3332. A sensing operation is performed in step 3334 for the memory cells connected to the word line selected for reading.

Figure 18D:
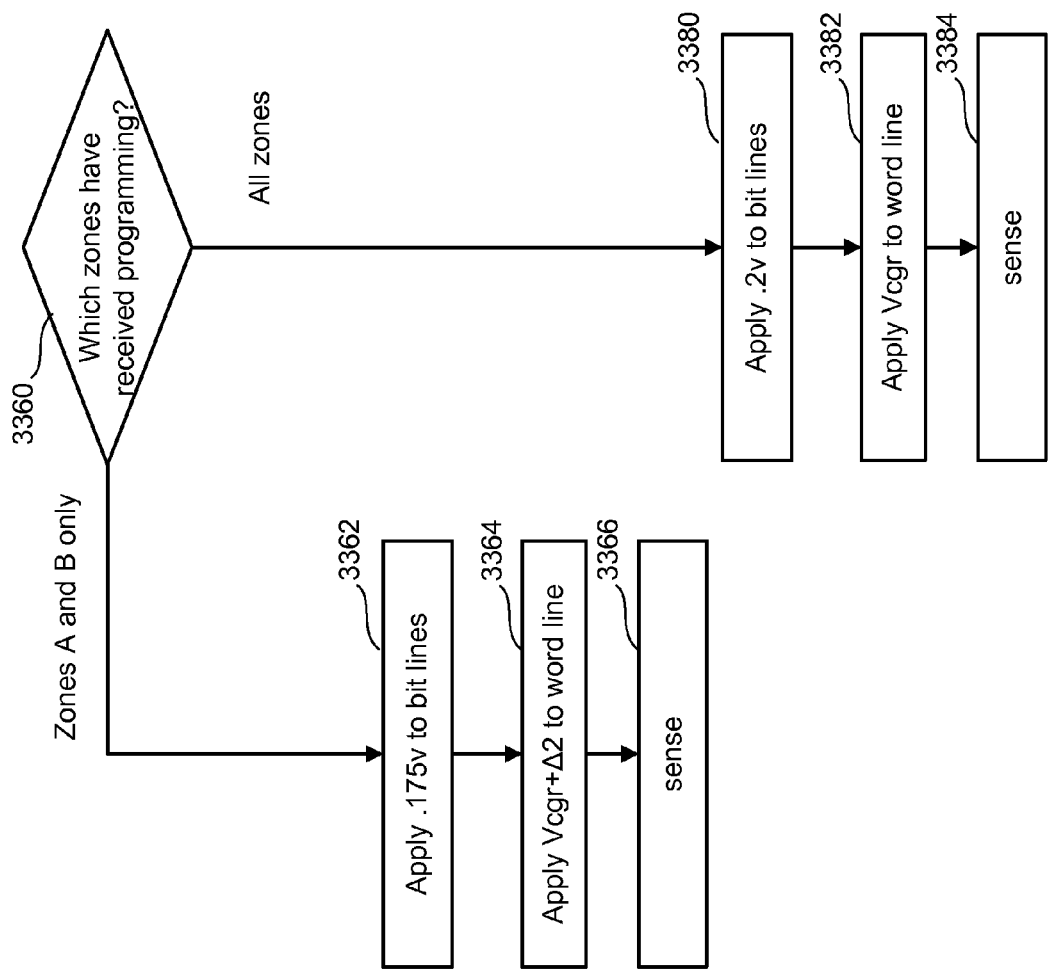

FIG. 18D is a flowchart describing one embodiment of the zone B read process of step 3254. In step 3360, the system determines which zones have received programming. In this situation, there are only two possibilities: zone A and zone B have both received programming or all three zones have received programming. If zone A and zone B have received programming, then in step 3362, the system applies 0.175 volts to the bit lines. In step 3364, a voltage is applied to the word line equal to the appropriate Vcgr+Δ2. In step 3366, a sensing operation is performed for the memory cells connected to the word line selected for reading.

If all zones have received some programming, then in step 3380, 0.2 volts is applied to the bit lines. In step 332, the appropriate Vcgr is applied to the word line. In step 3384, a sensing operation is performed for the memory cells connected to the word line selected for reading.

FIG. 18E is a flow chart describing one embodiment of the zone C read process of step 3256 of FIG. 18B. In step 3402, the system applies 0.2 volts to the bit lines. In step 3404, the appropriate Vcgr is applied to the word line. In step 3406, a sensing operation is performed for the memory cells connected to the word line selected for reading.

Since FIGS. 18C, 18D, and 18E are part of the process of FIG. 18B, and FIG. 18B is performed as part of step 1206 of FIG. 12B, then FIGS. 18B-E can be performed multiple times during a read process in order to obtain the appropriate data states stored by the memory cells selected for reading.

Looking at FIG. 18A as compared to FIGS. 18C and 18D, in some cases when reading the memory cells connected to a set of word lines in zone A or zone B a different compare voltage is used in zone A for the same data state than the compare voltage used for zone B. In other cases, the same compare voltage can be used depending on the zones being read and the timing of the programming and the reading. For example, when programming in zone A, the system may apply a first set of one or more bit line voltages to the plurality of bit lines. In some of the embodiments described above, a set of one or more bit line voltages would only include one voltage. In other embodiments, the voltage applied to the bit line can vary by bit line by nominal amounts or more than nominal amounts. The system will verify programming for the memory cells connected to the first set of word lines and the plurality of bit lines in response to the first set of one or more bit line voltages. Later on, when programming to zone C, the system will apply a second set of one or more bit line voltages to the plurality of bit lines. The first set of one or more bit line voltages are lower than the second set of one or more bit line voltages. For example, looking at FIG. 18A, when programming zone A (step 3202), a lower voltage (0.15 volts) is used than when programming zone C and applying 0.2 volts (step 3230). This same differential also exists in FIG. 17A. The system will verify programming for the memory cells connected to the second set of word lines (e.g. zone C) and the same bit lines in response to the second set of one or more bit line voltages. At some point, reading will be performed. Depending on the timing of the reading (when all word lines of the block have been programmed or before all word lines are programmed), the various bit line voltages and word line offset voltages can change. In different embodiments, based on different timing, either the verifying of the programming of the memory cells connected to the first set of word lines or the reading of the memory cells connected to the first set of word lines includes applying a compare voltage for a data state on the first set of word lines that is different than another compare voltage for the same data state used for memory cells connected to the second set of word lines (ie in a different zone). For example, FIG. 17B shows step 3104 reducing the word line voltage by Δ1 as compared to step 3132 for the same data state. FIGS. 18C-E also show different compare voltages applied to different word lines in different zones for the same data state (step 3304 applies Vcgr+Δ1, step 3364 applies Vcgr+Δ2 and step 3404 applies Vcgr). These different voltages are used throughout the operational cycle of a memory system. For example in the embodiment based on FIGS. 18A-E, the branching in FIG. 18A would change as a block is programmed. Similarly, based on when the block is read in relation to programming, the branching in FIG. 18C and FIG. 18D would also change. Depending on which word line is read, the branching in FIG. 18B would change.

As FIG. 12B includes an iteration of steps 1206 and 1208, the bit line voltages will be reapplied multiple times when reading data from a single word line. In many cases, a read request will request data for multiple word lines in which case the process of FIG. 12B will be performed multiple times and the bit line voltage will be reapplied multiple times.

Figure 19:
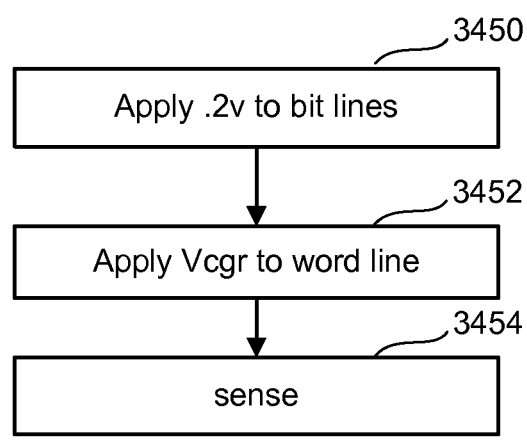
FIG. 19 is a flowchart describing one embodiment for performing a read process.

FIG. 19 is a flowchart describing another embodiment of a read operation associated with the embodiment of FIG. 18A (and associated with the embodiment of FIG. 16A). The read operation of FIG. 19 is performed during step 1206 of FIG.

12B. That is, in one embodiment, verify operations are performed according to FIG. 18A and read operations are performed according to FIG. 19. In step 3450, the system applies 0.2 v to the bit lines. Step 3452, the appropriate Vcgr (Vr1, Vr2, Vr3, . . . ) is applied to the word line being read. In step 3454, a sensing operation is performed (as discussed above).

One embodiment comprises a method for operating non-volatile storage, comprising: applying a first set of one or more bit line voltages to a plurality of bit lines; verifying programming for non-volatile storage elements connected to a first set of word lines and the plurality of bit lines in response to the first set of one or more bit line voltages; applying a second set of one or more bit line voltages to the plurality of bit lines, the first set of one or more bit line voltages are lower than the second set of one or more bit line voltages; verifying programming for non-volatile storage elements connected to a second set of word lines and the plurality of bit lines in response to the second set of one or more bit line voltages, the non-volatile storage elements connected to the first set of word lines are programmed prior to the non-volatile storage elements connected to the second set of word lines after a common erasing; applying one or more read bit line voltages to the plurality of bit lines; and reading the non-volatile storage elements connected to the first set of word lines and the plurality of bit lines in response to the one or more read bit line voltages, either the verifying programming for non-volatile storage elements connected to the first set of word lines or the reading the non-volatile storage elements connected to the first set of word lines includes applying a compare voltage for a data state on the first set of word lines that is different than another compare voltage for the data state used for non-volatile storage elements connected to the second set of word lines.

In one implementation, the first set of word lines comprise a first zone of word lines in a block; the second set of word lines comprise a second zone of word lines in a block, the first zone is closer to a source line than the second zone; and the one or more read bit line voltages are different than the first set of one or more bit line voltages.

In one implementation, the process includes re-applying the one or more read bit line voltages to the plurality of bit lines; and reading the non-volatile storage elements connected to the second set of word lines and the plurality of bit lines in response to the re-applying the one or more read bit line voltages, the second set of one or more bit line voltages consists of one specific bit line voltage, the one or more read bit line voltages also consists of the one specific bit line voltage.

In one implementation, the verifying programming for non-volatile storage elements connected to the first set of word includes applying the compare voltage for the data state, wherein the compare voltage is higher than the another compare voltage for the data state used for non-volatile storage elements connected to the second set of word lines; and the one or more read bit line voltages are different that first set of one or more bit line voltages.

In one implementation, the reading the non-volatile storage elements connected to the first set of word lines includes applying the compare voltage for the data state, wherein the compare voltage is lower than the another compare voltage for the data state used for non-volatile storage elements connected to the second set of word lines; and the one or more read bit line voltages are different that first set of one or more bit line voltages.

In one implementation, the first set of one or more bit line voltages remain constant during the verifying programming for the non-volatile storage elements connected to the first set of word lines; and the one or more read bit line voltages remain constant during the reading the non-volatile storage elements connected to the first set of word lines.

In one implementation, the process further includes applying a third set of one or more bit line voltages to the plurality of bit lines; and verifying programming for non-volatile storage elements connected to a third set of word lines and the plurality of bit lines in response to the third set of one or more bit line voltages, the first set of one or more bit line voltages are lower than the third set of bit lines voltages, the third set of one or more bit line voltages are lower than the second set of bit lines voltages.

In one implementation, the verifying programming for non-volatile storage elements connected to the second set of word lines includes applying a first verify compare voltage to the second set of word lines for a first state; the verifying programming for non-volatile storage elements connected to the first set of word lines includes applying the first verify compare voltage plus a first offset to the first set of word lines for the first state; and the verifying programming for non-volatile storage elements connected to the third set of word lines includes applying the first verify compare voltage plus a second offset to the third set of word lines for the first state.

In one implementation, the process further includes determining whether non-volatile storage elements connected to said first set of word lines, said second set of word lines and said third set of word lines are programmed; and if non-volatile storage elements connected to said first set of word lines, said second set of word lines and said third set of word lines are programmed, then: reading the non-volatile storage elements connected to the second set of word lines and the plurality of bit lines in response to the one or more read bit line voltages, and reading the non-volatile storage elements connected to the third set of word lines and the plurality of bit lines in response to the one or more read bit line voltages, the one or more read bit line voltages are the second set of one or more bit line voltages.

In one implementation, the process further includes: determining whether non-volatile storage elements connected to said first set of word lines, said second set of word lines and said third set of word lines are programmed; and if non-volatile storage elements connected to said first set of word lines and third set of word lines are programmed but non-volatile storage elements connected to said second set of word lines are not programmed, then: reading the non-volatile storage elements connected to the third set of word lines and the plurality of bit lines in response to the one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage for the first data state plus the second offset.

In one implementation, the process further includes determining whether non-volatile storage elements connected to said first set of word lines, said second set of word lines and said third set of word lines are programmed, if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes applying a read compare voltage for the first data state plus the first offset.

In one implementation, the process further includes if non-volatile storage elements connected to said first set of word lines and third set of word lines are programmed but non-volatile storage elements connected to said second set of word lines are not programmed, then reading the non-volatile storage elements connected to the third set of word lines and the plurality of bit lines in response to applying one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage for the first data state plus the second offset; if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes applying a read compare voltage for the first data state plus the first offset.

One embodiment comprises a non-volatile storage apparatus, comprising: a plurality of non-volatile storage elements; a plurality of word lines including a first set of word lines and a second set of word lines; a plurality of bit lines connected to the non-volatile storage elements; one or more managing circuits in communication with the plurality of bit lines and the plurality of word lines, the one or more managing circuits apply a first set of one or more bit line voltages to the plurality of bit lines, the one or more managing circuits verify programming for non-volatile storage elements connected to the first set of word lines and the plurality of bit lines in response to the first set of one or more bit line voltages, the one or more managing circuits apply a second set of one or more bit line voltages to the plurality of bit lines, the first set of one or more bit line voltages are lower than the second set of one or more bit line voltages, the one or more managing circuits verify programming for non-volatile storage elements connected to the second set of word lines and the plurality of bit lines in response to the second set of one or more bit line voltages, the non-volatile storage elements connected to the first set of word lines are programmed prior to the non-volatile storage elements connected to the second set of word lines after a common erasing, the one or more managing circuits apply one or more read bit line voltages to the plurality of bit lines, the one or more managing circuits read the non-volatile storage elements connected to the first set of word lines and the plurality of bit lines in response to the one or more read bit line voltages, either the verifying programming for non-volatile storage elements connected to the first set of word lines or the reading the non-volatile storage elements connected to the first set of word lines includes applying a compare voltage for a data state on the first set of word lines that is different than another compare voltage for the data state used for non-volatile storage elements connected to the second set of word lines.

One embodiment comprises a method for non-volatile storage, comprising: applying a first set of one or more bit line voltages to a plurality of bit lines; verifying programming for non-volatile storage elements connected to a first set of word lines and the plurality of bit lines in response to the first set of one or more bit line voltages; applying a second set of one or more bit line voltages to the plurality of bit lines, the first set of one or more bit line voltages are lower than the second set of one or more bit line voltages; verifying programming for non-volatile storage elements connected to a second set of word lines and the plurality of bit lines in response to the second set of one or more bit line voltages, the non-volatile storage elements connected to the first set of word lines are programmed prior to the non-volatile storage elements connected to the second set of word lines after a common erasing; applying one or more read bit line voltages to the plurality of bit lines; and reading the non-volatile storage elements connected to the first set of word lines and the plurality of bit lines in response to the one or more read bit line voltages, the verifying programming for non-volatile storage elements connected to the first set of word lines includes applying a first compare voltage for a data state on the first set of word lines and the reading the non-volatile storage elements connected to the first set of word lines includes applying a second compare voltage for the data state on the first set of word lines, the first and second compare voltages are different than a third compare voltage for the data state used for verifying the non-volatile storage elements connected to the second set of word lines and a fourth compare voltage for the data state used for verifying the non-volatile storage elements connected to the second set of word lines.

One embodiment comprises a method for using non-volatile storage, comprising: programming a plurality of non-volatile storage elements, each non-volatile storage element is connected to one word line of a plurality of sets of one or more adjacent word lines, each non-volatile storage element is connected to one bit line of a plurality of bit lines; and verifying the programming of the non-volatile storage elements, for each of the plurality of the sets of adjacent word lines, applying one of a plurality of verify compare voltages to the word lines and one of a plurality of verify bit line voltages to the bit lines during the verifying the programming of the non-volatile storage elements connected thereto, a magnitude of a verify compare voltage applied to a set of word lines decreases with a distance of the set of word lines to a source select line, a magnitude of a verify bit line voltage increases with the distance of the set of word lines to the source select line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating non-volatile storage, comprising:
   applying a first set of one or more bit line voltages to a plurality of bit lines;
   verifying programming for non-volatile storage elements connected to a first set of word lines and the plurality of bit lines in response to the first set of one or more bit line voltages;
   applying a second set of one or more bit line voltages to the plurality of bit lines, the first set of one or more bit line voltages are lower than the second set of one or more bit line voltages;
   verifying programming for non-volatile storage elements connected to a second set of word lines and the plurality of bit lines in response to the second set of one or more bit line voltages, the non-volatile storage elements connected to the first set of word lines are programmed prior to programming of the non-volatile storage elements connected to the second set of word lines after a common erasing, the non-volatile storage elements connected to the first set of word lines and the non-volatile storage elements connected to the second set of word lines are in a common block;

applying one or more read bit line voltages to the plurality of bit lines; and reading the non-volatile storage elements connected to the first set of word lines and the plurality of bit lines in response to the one or more read bit line voltages, either the verifying programming for non-volatile storage elements connected to the first set of word lines or the reading the non-volatile storage elements connected to the first set of word lines includes applying a compare voltage to a selected word line for a data state on the first set of word lines that is different than another compare voltage for the data state used for non-volatile storage elements connected to the second set of word lines.

2. The method of claim 1, wherein:
the first set of word lines comprise a first zone of word lines in the common block;
the second set of word lines comprise a second zone of word lines in the common block, the first zone is closer to a source line than the second zone; and
the one or more read bit line voltages are different than the first set of one or more bit line voltages.

3. The method of claim 2, further comprising:
re-applying the one or more read bit line voltages to the plurality of bit lines; and
reading the non-volatile storage elements connected to the second set of word lines and the plurality of bit lines in response to the re-applying the one or more read bit line voltages, the second set of one or more bit line voltages consists of one specific bit line voltage, the one or more read bit line voltages also consists of the one specific bit line voltage.

4. The method of claim 1, wherein:
the verifying programming for non-volatile storage elements connected to the first set of word includes applying the compare voltage for the data state, wherein the compare voltage is higher than the another compare voltage for the data state used for non-volatile storage elements connected to the second set of word lines; and
the one or more read bit line voltages are different that first set of one or more bit line voltages.

5. The method of claim 1, wherein:
the reading the non-volatile storage elements connected to the first set of word lines includes applying the compare voltage for the data state, wherein the compare voltage is lower than the another compare voltage for the data state used for non-volatile storage elements connected to the second set of word lines; and
the one or more read bit line voltages are different that first set of one or more bit line voltages.

6. The method of claim 1, wherein:
the first set of one or more bit line voltages remain constant during the verifying programming for the non-volatile storage elements connected to the first set of word lines; and
the one or more read bit line voltages remain constant during the reading the non-volatile storage elements connected to the first set of word lines.

7. The method of claim 1, further comprising:
applying a third set of one or more bit line voltages to the plurality of bit lines; and verifying programming for non-volatile storage elements connected to a third set of word lines and the plurality of bit lines in response to the third set of one or more bit line voltages, the first set of one or more bit line voltages are lower than the third set of bit lines voltages, the third set of one or more bit line voltages are lower than the second set of bit lines voltages.

8. The method of claim 7, wherein:
the verifying programming for non-volatile storage elements connected to the second set of word lines includes applying a first verify compare voltage to the second set of word lines for a first state;
the verifying programming for non-volatile storage elements connected to the first set of word lines includes applying the first verify compare voltage plus a first offset to the first set of word lines for the first state; and
the verifying programming for non-volatile storage elements connected to the third set of word lines includes applying the first verify compare voltage plus a second offset to the third set of word lines for the first state.

9. The method of claim 8, further comprising:
determining whether non-volatile storage elements connected to said first set of word lines, said second set of word lines and said third set of word lines are programmed; and
if non-volatile storage elements connected to said first set of word lines, said second set of word lines and said third set of word lines are programmed, then:
reading the non-volatile storage elements connected to the second set of word lines and the plurality of bit lines in response to the one or more read bit line voltages, and reading the non-volatile storage elements connected to the third set of word lines and the plurality of bit lines in response to the one or more read bit line voltages, the one or more read bit line voltages are the second set of one or more bit line voltages.

10. The method of claim 8, further comprising:
determining whether non-volatile storage elements connected to said first set of word lines, said second set of word lines and said third set of word lines are programmed; and
if non-volatile storage elements connected to said first set of word lines and third set of word lines are programmed but non-volatile storage elements connected to said second set of word lines are not programmed, then:
reading the non-volatile storage elements connected to the third set of word lines and the plurality of bit lines in response to the one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage to the selected word line for the first data state plus the second offset.

11. The method of claim 8, further comprising:
determining whether non-volatile storage elements connected to said first set of word lines, said second set of word lines and said third set of word lines are programmed, if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes applying a read compare voltage to the selected word line for the first data state plus the first offset.

12. The method of claim 9, further comprising:
if non-volatile storage elements connected to said first set of word lines and third set of word lines are programmed but non-volatile storage elements connected to said second set of word lines are not programmed, then reading the non-volatile storage elements connected to the third set of word lines and the plurality of bit lines in response to applying one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage to the selected word line for the first data state plus the second offset;
if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes applying a read compare voltage to the selected word line for the first data state plus the first offset.

13. A non-volatile storage apparatus, comprising:
a plurality of non-volatile storage elements;
a plurality of word lines including a first set of word lines and a second set of word lines, non-volatile storage elements connected to the first set of word lines and non-volatile storage elements connected to the second set of word lines are in a common block;
a plurality of bit lines connected to the non-volatile storage elements; and
one or more managing circuits in communication with the plurality of bit lines and the plurality of word lines, the one or more managing circuits apply a first set of one or more bit line voltages to the plurality of bit lines, the one or more managing circuits verify programming for non-volatile storage elements connected to the first set of word lines and the plurality of bit lines in response to the first set of one or more bit line voltages, the one or more managing circuits apply a second set of one or more bit line voltages to the plurality of bit lines, the first set of one or more bit line voltages are lower than the second set of one or more bit line voltages, the one or more managing circuits verify programming for non-volatile storage elements connected to the second set of word lines and the plurality of bit lines in response to the second set of one or more bit line voltages, the non-volatile storage elements connected to the first set of word lines are programmed prior to the non-volatile storage elements connected to the second set of word lines after a common erasing, the one or more managing circuits apply one or more read bit line voltages to the plurality of bit lines, the one or more managing circuits read the non-volatile storage elements connected to the first set of word lines and the plurality of bit lines in response to the one or more read bit line voltages, either the verifying programming for non-volatile storage elements connected to the first set of word lines or the reading the non-volatile storage elements connected to the first set of word lines includes applying a compare voltage to a selected word line for a data state on the first set of word lines that is different than another compare voltage for the data state used for non-volatile storage elements connected to the second set of word lines.

14. The non-volatile storage apparatus of claim 13, wherein:
the one or more managing circuits re-apply the one or more read bit line voltages to the plurality of bit lines and read the non-volatile storage elements connected to the second set of word lines and the plurality of bit lines in response to the re-applying the one or more read bit line voltages, the second set of one or more bit line voltages consists of one specific bit line voltage, the one or more read bit line voltages also consists of the one specific bit line voltage.

15. The non-volatile storage apparatus of claim 13, wherein:
the verifying programming for non-volatile storage elements connected to the first set of word includes the one or more managing circuits applying the compare voltage for the data state, wherein the compare voltage is higher than the another compare voltage for the data state used for non-volatile storage elements connected to the second set of word lines, the one or more read bit line voltages are different that first set of one or more bit line voltages.

16. The non-volatile storage apparatus of claim 13, wherein:
the reading the non-volatile storage elements connected to the first set of word lines includes the one or more managing circuits applying the compare voltage for the data state, wherein the compare voltage is lower than the another compare voltage for the data state used for non-volatile storage elements connected to the second set of word lines, the one or more read bit line voltages are different that first set of one or more bit line voltages.

17. The non-volatile storage apparatus of claim 13, wherein:
the plurality of word lines including a third set of word lines; and
the one or more managing circuits apply a third set of one or more bit line voltages to the plurality of bit lines and verify programming for non-volatile storage elements connected to the third set of word lines and the plurality of bit lines in response to the third set of one or more bit line voltages, the first set of one or more bit line voltages are lower than the third set of bit lines voltages, the third set of one or more bit line voltages are lower than the second set of bit lines voltages.

18. The non-volatile storage apparatus of claim 17, wherein:
the verifying programming for non-volatile storage elements connected to the second set of word lines includes the one or more managing circuits applying a first verify compare voltage to the second set of word lines for a first state;
the verifying programming for non-volatile storage elements connected to the first set of word lines includes the one or more managing circuits applying the first verify compare voltage plus a first offset to the first set of word lines for the first state; and
the verifying programming for non-volatile storage elements connected to the third set of word lines includes the one or more managing circuits applying the first verify compare voltage plus a second offset to the second set of word lines for the first state.

19. The non-volatile storage apparatus of claim 18, wherein:

the one or more managing circuits determine whether non-volatile storage elements connected to said first set of word lines, said second set of word lines and said third set of word lines are programmed; and if non-volatile storage elements connected to said first set of word lines, said second set of word lines and said third set of word lines are programmed, then:

the one or more managing circuits read the non-volatile storage elements connected to the second set of word lines and the plurality of bit lines in response to the one or more read bit line voltages and read the non-volatile storage elements connected to the third set of word lines and the plurality of bit lines in response to the one or more read bit line voltages, the one or more read bit line voltages are the second set of one or more bit line voltages.

20. The non-volatile storage apparatus of claim 18, wherein:

the one or more managing circuits determine whether non-volatile storage elements connected to said first set of word lines, said second set of word lines and said third set of word lines are programmed; and if non-volatile storage elements connected to said first set of word lines and third set of word lines are programmed but non-volatile storage elements connected to said second set of word lines are not programmed, then the one or more managing circuits read the non-volatile storage elements connected to the third set of word lines and the plurality of bit lines in response to the one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage for the first data state plus the second offset.

21. The non-volatile storage apparatus of claim 18, wherein:

the one or more managing circuits determine whether non-volatile storage elements connected to said first set of word lines, said second set of word lines and said third set of word lines are programmed, if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes the one or more managing circuits applying a read compare voltage for the first data state plus the first offset.

22. The non-volatile storage apparatus of claim 18, wherein:

the one or more managing circuits determine whether non-volatile storage elements connected to said first set of word lines, said second set of word lines and said third set of word lines are programmed;

if non-volatile storage elements connected to said first set of word lines and third set of word lines are programmed but non-volatile storage elements connected to said second set of word lines are not programmed, then the one or more managing circuits read the non-volatile storage elements connected to the third set of word lines in response to applying the one or more read bit line voltages, the one or more read bit line voltages are the third set of one or more bit line voltages, the reading of the non-volatile storage elements connected to the third set of word line and the reading of the non-volatile storage elements connected to the first set of word lines includes applying a read compare voltage for the first data state plus the second offset; and if non-volatile storage elements connected to said first set of word lines are programmed but non-volatile storage elements connected to said second set of word lines and third set of word lines are not programmed, then the one or more read bit line voltages are the first set of one or more bit line voltages and the reading of the non-volatile storage elements connected to the first set of word lines includes applying a read compare voltage for the first data state plus the first offset.

23. A method for operating non-volatile storage, comprising:

applying a first set of one or more bit line voltages to a plurality of bit lines;

verifying programming for non-volatile storage elements connected to a first set of word lines and the plurality of bit lines in response to the first set of one or more bit line voltages;

applying a second set of one or more bit line voltages to the plurality of bit lines, the first set of one or more bit line voltages are lower than the second set of one or more bit line voltages;

verifying programming for non-volatile storage elements connected to a second set of word lines and the plurality of bit lines in response to the second set of one or more bit line voltages, the non-volatile storage elements connected to the first set of word lines are programmed prior to programming the non-volatile storage elements connected to the second set of word lines after a common erasing, the non-volatile storage elements connected to the first set of word lines and the non-volatile storage elements connected to the second set of word lines are in a common block;

applying one or more read bit line voltages to the plurality of bit lines; and reading the non-volatile storage elements connected to the first set of word lines and the plurality of bit lines in response to the one or more read bit line voltages, the verifying programming for non-volatile storage elements connected to the first set of word lines includes applying a first compare voltage to a selected word line for a data state on the first set of word lines and the reading the non-volatile storage elements connected to the first set of word lines includes applying a second compare voltage to the selected word line for the data state on the first set of word lines, the first and second compare voltages are different than a third compare voltage for the data state used for verifying programming of non-volatile storage elements connected to the second set of word lines and a fourth compare voltage for the data state used for reading the non-volatile storage elements connected to the second set of word lines.

24. The method of claim 23, wherein:
the first compare voltage is higher than the third compare voltage.

25. The method of claim 23, wherein:
the second compare voltage is lower than the fourth compare voltage.

26. A method for using non-volatile storage, comprising:
programming a plurality of non-volatile storage elements, each non-volatile storage element is connected to one word line of a plurality of sets of one or more adjacent word lines, each non-volatile storage element is connected to one bit line of a plurality of bit lines; and verifying the programming of the non-volatile storage elements, for each of the plurality of the sets of adjacent word lines, applying one of a plurality of verify compare voltages to the word lines and one of a plurality of verify bit line voltages to the bit lines during the verifying of the programming of the non-volatile storage elements connected thereto, a magnitude of a verify compare voltage applied to a set of word lines decreases with a distance of the set of word lines to a source select line, a magnitude of a verify bit line voltage increases with the distance of the set of word lines to the source select line.

27. The method of claim 26, further comprising:

reading the programming of the non-volatile storage elements, for each of the plurality of the sets of adjacent word lines, applying one of a plurality of read compare voltages to the word lines and one of a plurality of read bit line voltages to the bit lines during the reading of the non-volatile storage elements connected thereto, a magnitude of a read compare voltage applied to the set of word lines decreases with a distance of a highest programmed set of word lines to the source select line, a magnitude of a read bit line voltage increases with the distance of the highest programmed set of word lines to the source select line, each word line in the highest programmed set of word lines is programmed and further from the source select line than any programmed word line not in the highest programmed set of word lines.

* * * * *